(12) United States Patent
Tanaka et al.

(10) Patent No.: US 8,969,130 B2
(45) Date of Patent: Mar. 3, 2015

(54) INSULATING FILM, FORMATION METHOD THEREOF, SEMICONDUCTOR DEVICE, AND MANUFACTURING METHOD THEREOF

(71) Applicant: Semiconductor Energy Laboratory Co., Ltd., Atsugi-shi, Kanagawa-ken (JP)

(72) Inventors: Tetsuhiro Tanaka, Isehara (JP); Erika Takahashi, Atsugi (JP); Yuki Imoto, Atsugi (JP); Yuhei Sato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/675,140

(22) Filed: Nov. 13, 2012

(65) Prior Publication Data

US 2013/0126861 A1 May 23, 2013

(30) Foreign Application Priority Data

Nov. 18, 2011 (JP) .................................. 2011-252213

(51) Int. Cl.
*H01L 21/00* (2006.01)
*H01L 29/786* (2006.01)
(Continued)

(52) U.S. Cl.
CPC ............ *H01L 29/7869* (2013.01); *H01L 21/36* (2013.01); *H01L 29/66742* (2013.01); *H01L 29/78603* (2013.01); *H01L 21/02189* (2013.01);
(Continued)

(58) Field of Classification Search
USPC ........................................................ 438/104
See application file for complete search history.

(56) References Cited

U.S. PATENT DOCUMENTS 4,360,598 A * 11/1982 Otagiri et al. ................. 501/103
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Nomura.K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
(Continued)

*Primary Examiner* — Reema Patel
(74) *Attorney, Agent, or Firm* — Eric J. Robinson; Robinson Intellectual Property Law Office, P.C.

(57) ABSTRACT

An amorphous region with low density is formed in an oxide insulating film containing zirconium. The amount of oxygen released from such an oxide insulating film containing zirconium by heating is large and a temperature at which oxygen is released is higher in the oxide insulating film than in a conventional oxide film (e.g., a silicon oxide film). When the insulating film is formed using a sputtering target containing zirconium in an oxygen atmosphere, the temperature of a surface on which the insulating film is formed may be controlled to be lower than a temperature at which a film to be formed starts to crystallize.

11 Claims, 16 Drawing Sheets

(51) Int. Cl.
*H01L 21/36* (2006.01)
*H01L 29/66* (2006.01)
*H01L 21/02* (2006.01)

(52) U.S. Cl.
CPC .... *H01L 21/02194* (2013.01); *H01L 21/02266* (2013.01)
USPC .................................. 438/104; 257/E21.461

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,346,228 | B1 * | 2/2002 | Choudhary et al. .......... 423/584 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,151,299 | B2 * | 12/2006 | Watanabe .................... 257/369 |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 * | 8/2008 | Endo et al. ..................... 257/43 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,824,957 | B2 * | 11/2010 | Umeda et al. ................. 438/104 |
| 7,910,929 | B2 | 3/2011 | Takayama et al. |
| 8,067,793 | B2 | 11/2011 | Akimoto |
| 8,134,156 | B2 | 3/2012 | Akimoto |
| 8,237,166 | B2 | 8/2012 | Kumomi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0233762 | A1 * | 9/2008 | Hong ............................ 438/763 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0152550 | A1 * | 6/2009 | Ohnuma et al. ................. 257/57 |
| 2009/0278122 | A1 | 11/2009 | Hosono et al. |
| 2009/0280600 | A1 | 11/2009 | Hosono et al. |
| 2009/0294765 | A1 * | 12/2009 | Tanaka et al. .................... 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0320459 | A1 | 12/2010 | Umeda et al. |
| 2011/0165740 | A1 | 7/2011 | Takayama et al. |
| 2011/0217815 | A1 | 9/2011 | Honda et al. |
| 2012/0058612 | A1 | 3/2012 | Akimoto |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2006-165528 | 6/2006 |
| JP | 2008-311342 | 12/2008 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) . Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphouse GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "SPINEL,YBFE2O4, and YB2FE3O7 Types of Structures for Compounds in the IN2O3 and SC2O3-A2O3-BO Systems [A;Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

Sample 1

Sample 1

Sample 2

Sample 2

INSULATING FILM, FORMATION METHOD THEREOF, SEMICONDUCTOR DEVICE, AND MANUFACTURING METHOD THEREOF

BACKGROUND OF THE INVENTION

1. Field of the Invention

The present invention relates to an insulating film and a method for forming the insulating film. The present invention also relates to a semiconductor device and a method for manufacturing the semiconductor device.

In this specification and the like, a "semiconductor device" generally means any device which can function by utilizing semiconductor characteristics, and an electro-optical device, a semiconductor circuit, and an electronic device are all semiconductor devices.

2. Description of the Related Art

A technique by which a thin film transistor is formed using a semiconductor thin film formed over an insulating surface has attracted attention. The transistor is applied to a wide range of electronic devices such as an integrated circuit (IC) and an image display device (display device). As a material of a semiconductor thin film applicable to the transistor, for example, a silicon based semiconductor material is widely known. As another material, an oxide semiconductor has been attracting attention.

For example, a transistor whose active layer is formed using an amorphous oxide containing indium (In), gallium (Ga), and zinc (Zn) is disclosed (Patent Document 1).

A transistor including an oxide semiconductor has on-state characteristics (e.g., on-state current) superior to those of a transistor including amorphous silicon. To apply the transistor including an oxide semiconductor to a high-performance device, such a transistor is required to have further improved characteristics, and thus techniques of crystallization of an oxide semiconductor have been developed (Patent Document 2). In Patent Document 2, a technique in which an oxide semiconductor is crystallized by heat treatment is disclosed.

Patent Document 3 discloses a transistor in which a thin film containing zinc oxide (ZnO) formed by a reactive solid-phase epitaxial growth over a single crystal yttria-stabilized zirconia (YSZ) substrate is used as an active layer.

REFERENCE

Patent Documents

[Patent Document 1] Japanese Published Patent Application No. 2006-165528
[Patent Document 2] Japanese Published Patent Application No. 2008-311342
[Patent Document 3] Japanese Published Patent Application No. 2004-103957

SUMMARY OF THE INVENTION

In a semiconductor device such as a transistor including an oxide semiconductor, when heat treatment is performed in a step after the formation of an oxide semiconductor film or when a film is formed over the oxide semiconductor film, oxygen in the oxide semiconductor film might be eliminated and oxygen vacancies might be generated owing to the influence of heat applied to the oxide semiconductor film. The oxygen vacancy in the oxide semiconductor film serves as a source of carriers and thus adversely affects electrical characteristics of the transistor. In particular, when a region where a number of oxygen vacancies are formed is placed between a source and a drain, the region serves as an unintentional path of carriers, that is, a parasitic channel, resulting in a problem of large leakage current flowing between the source and the drain of the transistor.

Since single crystal YSZ disclosed in Patent Document 3 is extremely stable, it is suitable for used in a reactive epitaxial growth which needs to be performed at extremely high temperatures. However, once oxygen in the oxide semiconductor film over the single crystal YSZ substrate is eliminated owing to the influence of heat treatment or heat applied in another step, oxygen vacancies in the oxide semiconductor film are maintained. Thus, such a material is not effective for suppressing oxygen vacancies in the oxide semiconductor film.

In view of these problems, an object of one embodiment of the present invention is to provide an insulating film capable of releasing oxygen or a method for forming the insulating film. Another object is to provide a semiconductor device having excellent electrical characteristics or a method for manufacturing the semiconductor device.

One embodiment of the present invention achieves at least one of the above objects.

To achieve the above objects, the present invention focuses on a structure in which an oxide insulating film containing zirconium is used as a film supplying oxygen to a semiconductor film. This comes from an idea that the oxide insulating film containing zirconium hardly affects electrical characteristics of a semiconductor device because it is extremely stable chemically and thermally. However, in general, a zirconium oxide film easily forms a stable crystalline state and a crystalline zirconium oxide film is thermally stable; thus, oxygen is hardly released even when heating is performed.

Thus, the present invention has arrived at an idea of forming an amorphous and low-density region in an oxide insulating film containing zirconium. An oxide insulating film containing zirconium formed by a formation method of one embodiment of the present invention has chemical stability and thermal stability and releases a large amount of oxygen by heating. In addition, the oxide insulating film containing zirconium can have a special effect in that oxygen is released at a temperature higher than the case of a conventional oxide film (e.g., a silicon oxide film).

Such an oxide insulating film can be formed in contact with a semiconductor film and oxygen can be supplied to the semiconductor film by heat treatment, whereby oxygen vacancies can be filled. Further, even when oxygen in the semiconductor film is eliminated owing to heat applied in a manufacturing process of a transistor, for example, oxygen vacancies in the semiconductor film can be effectively filled by heat treatment at higher temperatures performed after the elimination of oxygen because the oxide insulating film can supply oxygen at high temperatures.

Such an oxide insulating film can be formed by a sputtering method. When an oxide insulating film is formed using a sputtering target containing zirconium in an oxygen atmosphere, the temperature of a surface on which the oxide insulating film is formed is controlled to be lower than a temperature at which the oxide insulating film which is being formed starts to crystallize, whereby an amorphous region with low density can be formed in the formed oxide insulating film.

That is, a method for forming an insulating film of one embodiment of the present invention is a method for forming an insulating film in an atmosphere containing oxygen by a sputtering method. A target used in the sputtering method contains zirconium. A temperature of a surface on which the insulating film is formed is controlled to be lower than a temperature at which the insulating film is completely crystallized. The insulating film is formed so that an amorphous region containing oxygen in excess of a stoichiometric composition in a crystalline state is formed in a part of the insulating film.

In the method for forming an insulating film of one embodiment of the present invention, the target may contain zirconium and yttrium.

It is preferable that a target containing yttrium be used and a zirconium oxide film containing yttrium be formed as the insulating film, because the structural stability is further increased.

In the method for forming an insulating film of one embodiment of the present invention, the temperature of the surface on which the insulating film is formed may be higher than or equal to 20° C. and lower than or equal to 100° C.

In particular, when the temperature of the surface on which the insulating film is formed is kept at such a temperature during formation of the insulating film, crystallization of the insulating film can be effectively suppressed and the proportion of a low-density region can be increased. In contrast, at a temperature higher than the above range, the crystallization of the film rapidly progresses and a region having crystallinity and extremely high density occupies a large part of the film, so that the amount of oxygen released from the insulating film is decreased.

In the method for forming an insulating film of one embodiment of the present invention, a partial pressure of oxygen in the atmosphere containing oxygen may be greater than or equal to 25% and less than or equal to 100%.

The proportion of oxygen in a deposition atmosphere is preferably as high as possible, because oxygen can be excessively contained in the insulating film and as a result, the amount of oxygen released from the formed insulating film can be increased. When the proportion of oxygen in the deposition atmosphere is insufficient, a region where the proportion of a metal element is excessive might be formed in the film and the film might lose an insulating property. The proportion (partial pressure) of oxygen in the deposition atmosphere is preferably greater than or equal to 25% and less than 100%, further preferably greater than or equal to 50% and less than 100%.

An insulating film of one embodiment of the present invention is an insulating film containing zirconium oxide. In an observation image of a cross section of the insulating film, an amorphous region and a cavity are seen in the film. In addition, a detection intensity of mass number 32 with respect to a temperature, which is obtained by thermal desorption spectroscopy, has one or more peaks.

An amorphous region is provided in the insulating film, whereby the amorphous region can contain oxygen in excess of the stoichiometric composition in a crystalline state. Further, by provision of such a cavity in the amorphous region, oxygen in a deposition atmosphere can be taken in the cavity as an oxygen molecule. Accordingly, the amount of oxygen released at the time of heating can be increased.

In the insulating film of one embodiment of the present invention, the detection intensity of mass number 32 with respect to the temperature, which is obtained by thermal desorption spectroscopy, may have a peak at a temperature higher than or equal to 350° C.

With the use of the manufacturing method, an insulating film which is capable of releasing oxygen at a temperature higher than the case of a conventional oxide film as described above can be formed. With such an insulating film, oxygen can be effectively supplied to a semiconductor film at high temperatures (the highest temperature in the manufacturing process).

The insulating film of one embodiment of the present invention may further contain yttrium oxide. A film density of the insulating film may be higher than or equal to 5.40 g/cm$^3$ and lower than or equal to 5.95 g/cm$^3$.

In particular, the film density of the insulating film containing zirconium oxide and yttrium oxide is preferably higher than or equal to 5.40 g/cm$^3$ and lower than or equal to 5.95 g/cm$^3$. When the insulating film is a film with such a low density, the oxygen content in the film can be increased with the structural stability maintained; thus, the amount of oxygen released from the film can be increased.

A semiconductor device of one embodiment of the present invention includes the insulating film of any of the above embodiments, an oxide semiconductor layer, a gate insulating layer, a gate electrode layer, a source electrode layer, and a drain electrode layer. The insulating film is provided in contact with the oxide semiconductor layer.

The insulating film can be applied to a semiconductor device such as a transistor in which an oxide semiconductor is used as a semiconductor where a channel is formed. Oxygen can be efficiently supplied particularly when the oxide semiconductor layer and the insulating film are provided in contact with each other or provided with a layer having oxygen permeability provided therebetween. In this case, a semiconductor device having excellent electrical characteristics can be obtained.

A method for manufacturing a semiconductor device of one embodiment of the present invention includes the following steps: a step of forming an insulating film by the above-described method for forming an insulating film, a step of forming an oxide semiconductor film, a step of processing the oxide semiconductor film to form an island-shaped oxide semiconductor layer, a step of forming a gate insulating layer, a step of forming a gate electrode layer, and a step of forming a source electrode layer and a drain electrode layer. The insulating film and the oxide semiconductor layer are formed in contact with each other. The insulating film and the oxide semiconductor film or the oxide semiconductor layer are heated at temperatures at which oxygen is eliminated from the insulating film after the steps of forming the insulating film and forming the oxide semiconductor film.

The method for forming an insulating film can be applied to the method for manufacturing a semiconductor device such as a transistor formed using an oxide semiconductor. With the insulating film provided in contact with the oxide semiconductor film or the island-shaped oxide semiconductor layer, oxygen can be supplied to the oxide semiconductor at sufficiently high temperatures. Thus, a semiconductor device such as a transistor having excellent electrical characteristics can be manufactured.

In the method for manufacturing a semiconductor device of one embodiment of the present invention, the insulating film and the oxide semiconductor film may be heated at a temperature higher than or equal to 350° C.

When the insulating film is heated at a sufficiently high temperature, i.e., a temperature higher than or equal to 350° C., the amount of oxygen supplied from the insulating film is increased. Further, when an oxide semiconductor is heated at high temperatures, rearrangement of constituent atoms in the oxide semiconductor layer is promoted. As a result, oxygen vacancies in the oxide semiconductor layer can be effectively filled by supplied oxygen and at the same time, the crystallinity of the oxide semiconductor layer can be improved.

One embodiment of the present invention can provide an insulating film which is capable of releasing oxygen. Further, one embodiment of the present invention can provide a semiconductor device having excellent electrical characteristics.

DETAILED DESCRIPTION OF THE INVENTION

Figure 1A:
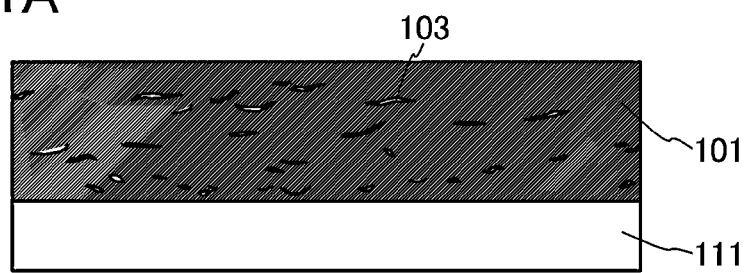
FIGS. 1A and 1B each illustrate an insulating film of one embodiment of the present invention.

Embodiments and examples of the present invention will be described in detail with reference to the accompanying drawings. Note that the invention is not limited to the following description, and it will be easily understood by those skilled in the art that various changes and modifications can be made without departing from the spirit and scope of the invention. Thus, the invention should not be construed as being limited to the description in the following embodiments. Note also that in the structures of one embodiment of the present invention described below, the same reference numerals in different drawings represent components that are identical or have similar functions, the description of which is not repeated.

Note that in each drawing of this specification, the size, the thickness, or the region of each component is exaggerated for clarity in some cases. Thus, embodiments of the present invention are not limited to such scales.

Embodiment 1

In this embodiment, characteristics of an insulating film of one embodiment of the present invention and a method for forming the insulating film will be described with reference to the drawings.

[Structural Example of Insulating Film]

A structural example of the insulating film of one embodiment of the present invention will be described below with reference to FIGS. 1A and 1B. FIG. 1A is a schematic cross-sectional view of an insulating film 101 of one embodiment of the present invention, formed over a substrate 111.

The insulating film 101 is an oxide insulating film containing at least zirconium.

As a material of the insulating film 101, besides zirconium oxide, zirconium oxide to which yttrium oxide is added is preferably used, so that the thermal stability is increased. Such zirconium oxide to which yttrium oxide is added is also referred to as yttria-stabilized zirconia (YSZ). For example, the YSZ may contain zirconium oxide and yttrium oxide at 0.57:0.43 to 0.99:0.01 in a molar ratio, preferably 0.85:0.15 to 0.98:0.02 in a molar ratio.

Alternatively, stabilized zirconia may be formed by containing calcium oxide, magnesium oxide, cerium oxide (ceria), hafnium oxide (hafnia), or aluminum oxide (alumina) instead of yttrium oxide.

The insulating film 101 preferably includes an amorphous region. Further, a cavity 103 is preferably included in the film.

In general, in the case where a zirconium oxide film is formed by a sputtering method, an evaporation method, a plasma chemical vapor deposition method (PCVD method), a pulsed laser deposition method (PLD method), an atomic layer deposition method (ALD method), a molecular beam epitaxy method (MBE method), or the like, a crystalline film having a cubic crystal structure and being strongly aligned with the (111) plane is formed as the zirconium oxide film. Further, a clear grain boundary in the growth direction (direction perpendicular to a surface on which the film is formed) is observed in the film.

In contrast, the insulating film 101 formed by a sputtering method using a method for forming an insulating film of one embodiment of the present invention, which will be described below, is not a completely crystallized film but a film with low density which includes an amorphous region and a cavity (also referred to as a gap, a space, or a pore).

The cavities 103 are dispersively formed in the insulating film 101. The cavity 103 has a cross-sectional shape which is long in a direction substantially parallel to a surface of the film and short in a direction substantially perpendicular to the surface of the film. The sizes of the cavities 103 are not uniform and the cavities 103 with a variety of sizes are dispersed in the film. For example, cavities with a variety of sizes are dispersed, which are each greater than or equal to 2 nm and less than or equal to 500 nm, preferably greater than or equal to 5 nm and less than or equal to 500 nm in the direction substantially parallel to the surface of the film and are each greater than or equal to 1 nm and less than or equal to 50 nm, preferably greater than or equal to 1 nm and less than or equal to 20 nm in the direction substantially perpendicular to the surface of the film. The cavities 103 may be uniformly dispersed in the film or may be localized in part of a region in the thickness direction (e.g., a region close to a surface on which the insulating film 101 is formed or a region close to the surface of the film).

Further, part of the insulating film 101 may be in a crystalline state. In that case, part of the insulating film 101 may have a region in which a grain boundary is observed in the growth direction.

Such a cavity 103 can be found by observing a cross-sectional shape of the insulating film 101 by scanning transmission electron microscopy (STEM).

The insulating film 101 has a low-density region, so that the insulating film 101 as a whole has a low film density. For example, in the case where a YSZ film is used as the insulating film 101, the film density thereof measured by X-ray reflectometry (XRR) is preferably higher than or equal to 5.40 g/cm$^3$ and lower than or equal to 5.95 g/cm$^3$. A YSZ film having a film density in the above range can have both the structural stability and the thermal stability and can release a large amount of oxygen. In contrast, a YSZ film having a film density higher than the above range has a low proportion of an amorphous region with low density in the film and the amount of oxygen released from the film, which is described later, is insufficient. Further, a YSZ film having a film density lower than the above range can release a large amount of oxygen; however, the structural stability thereof is low and insufficient to apply the film to a semiconductor device such as a transistor.

The insulating film 101 has a feature of releasing oxygen by heat and can release oxygen at a temperature higher than the case of a conventional oxide film. For example, the detection intensity of mass number 32, which corresponds to the mass number of an oxygen molecule, obtained by thermal desorption spectroscopy (TDS) has a peak at a temperature higher than or equal to 350° C., preferably higher than or equal to 400° C. Note that $CH_3OH$ can also be given as a substance having mass number 32, but is not taken into consideration on the assumption that it is unlikely to be present in the film or on the surface of the film. Further, an oxygen molecule including an oxygen atom having mass number 17 or 18 which is an isotope of an oxygen atom is not taken into consideration either because the proportion of such a molecule in the natural world is minimal.

Figure 1B:
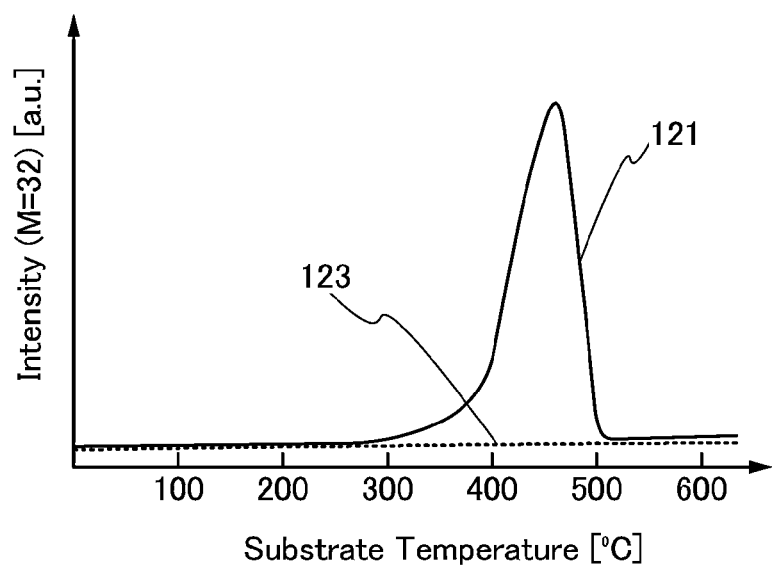

Here, an example of results obtained by TDS is shown in FIG. 1B. FIG. 1B shows the detection intensity of mass number 32 with respect to the substrate temperature. In FIG. 1B, a detection intensity 121 in terms of the insulating film 101 is indicated by a solid line. In addition, a detection intensity 123 in terms of an oxide insulating film containing zirconia which has extremely high crystallinity is indicated by a dotted line in FIG. 1B for comparison.

As shown in FIG. 1B, the detection intensity 121 in terms of the insulating film 101 of one embodiment of the present invention has at least one peak, preferably at a temperature higher than or equal to 350° C., further preferably at a temperature higher than or equal to 400° C. On the other hand, oxygen is hardly released from the insulating film having high crystallinity, so that a clear peak is not observed at any temperature.

Note that in the case where a silicon oxide film containing excess oxygen is observed as a conventional oxide insulating film, for example, a peak of the amount of released oxygen can be observed at a relatively low temperature of from 200° C. to 350° C. The insulating film 101 of one embodiment of the present invention has a feature of having a peak of the amount of released oxygen at a temperature higher than the case of such a conventional insulating film.

Here, a process of oxygen release from the insulating film 101 of one embodiment of the present invention will be described.

The amorphous region with low density in the insulating film 101 contains excess oxygen. Specifically, the region with low density contains oxygen in excess of the stoichiometric composition. Further, oxygen contained in a deposition gas used in a method for forming the insulating film which will be described later exists as an oxygen molecule in the cavity 103 in the film.

When such an insulating film 101 is heated, atoms are rearranged by the heat and crystallization progresses in the depth direction from the surface of the film, at which dynamic degree of freedom is relatively high. Thus, a layer containing excess oxygen is formed in a region that is in the insulating film 101 and close to the substrate 111 during the crystallization. Excess oxygen is eliminated as an oxygen molecule from the layer containing excess oxygen formed in such a manner and released outside the film through a grain boundary in an upper layer of the insulating film 101.

As described above, oxygen is released from the insulating film 101 owing to rearrangement of atoms in the film; thus, oxygen is less likely to be released at low temperatures, and a specific peak of the amount of released oxygen is observed by TDS at high temperatures at which the atoms are rearranged. The amount of released oxygen is proportional to the amount of excess oxygen contained in the insulating film 101 immediately after the formation of the insulating film 101 and to the thickness of the insulating film 101.

In contrast, the insulating film containing zirconium oxide which has extremely high crystallinity is less likely to contain oxygen in excess of the stoichiometric composition immediately after the film is formed, owing to its crystallinity. Thus, oxygen is hardly released even when the film is heated by heat treatment performed later at temperatures at which atoms are rearranged.

The above is a description of the insulating film of one embodiment of the present invention.

[Method for Forming Insulating Film]

A method for forming the insulating film of one embodiment of the present invention will be described below.

The insulating film 101 can be formed over a surface of the substrate 111, on which the insulating film 101 is formed in an atmosphere containing oxygen by a sputtering method.

A sputtering target containing at least zirconium is used as a target used in a sputtering method. A sputtering target containing zirconium oxide is preferably used. In particular, a sputtering target containing zirconium oxide and yttrium oxide is preferably used. Alternatively, a sputtering target containing zirconium oxide and any of calcium oxide, magnesium oxide, cerium oxide, hafnium oxide, and aluminum oxide can be used instead of the sputtering target containing zirconium oxide and yttrium oxide.

The insulating film 101 is formed with the temperature of the surface on which the insulating film 101 is formed controlled to be low enough so that crystallization of the insulating film 101 does not progress. Specifically, the insulating film 101 is formed by a sputtering method with the temperature of the surface of the substrate 111, on which the insulating film 101 is formed kept at a temperature higher than or equal to 20° C. and lower than or equal to 100° C.

When the insulating film 101 is formed at such a low temperature, crystallization of the film during deposition can be effectively suppressed and the proportion of the low-density region in the film can be increased.

In contrast, in the case where the temperature of the surface on which the insulating film 101 is formed during deposition is set at a temperature higher than 100° C., crystallization of the film rapidly progresses. As a result, a region having high density and crystallinity occupies a large part of the film, so that the amount of excess oxygen contained in the film is reduced. Further, an insulating film formed under such a condition becomes a film in which columnar-like crystals grown in the thickness direction aggregated densely.

In the case where the temperature of the surface on which the insulating film 101 is formed is kept at a temperature lower than 20° C., a film having a region with low density can be formed. However, it is not preferable because a cooling system needs to be provided in a deposition apparatus.

The insulating film 101 is formed in an atmosphere containing oxygen. For example, a mixed gas of oxygen and a diluted gas made of a rare gas such as argon can be used as a deposition gas used for the deposition. Alternatively, oxygen can be used alone as a deposition gas.

The proportion of oxygen in a deposition atmosphere is preferably as high as possible, because the amount of excess oxygen contained in the insulating film 101 can be increased. On the other hand, the proportion of oxygen in a deposition atmosphere is low particularly in the case where a metal target is used as a sputtering target, for example, a region where the proportion of the metal element is excessive might be formed in the film and the film might lose an insulating property. The partial pressure of oxygen in the deposition atmosphere is preferably greater than or equal to 25% and less than 100%, further preferably greater than or equal to 50% and less than 100%.

The region with low density is easily formed in the film when the pressure during deposition is high. However, high pressure might adversely affect the deposition rate stability and the structural stability of the formed film. For example, the pressure during deposition may be greater than or equal to 0.1 Pa and less than or equal to 5 Pa, preferably greater than or equal to 0.2 Pa and less than or equal to 2 Pa.

When the insulating film 101 is formed by a sputtering method under such conditions, the insulating film 101 which has a high oxygen releasing property and can release oxygen at high temperatures as described above can be formed. When such an insulating film 101 is applied to a semiconductor device including an oxide semiconductor, a highly reliable semiconductor device can be obtained.

This embodiment can be combined with any of the other embodiments and example described in this specification as appropriate.

Embodiment 2

In this embodiment, a semiconductor device to which the insulating film described in Embodiment 1 as an example is applied and a method for manufacturing the semiconductor device will be described with reference to the drawings.

Note that in this embodiment, the description of the same portions as in the above embodiment is omitted or is simply given.

Structural Example 1

In this structural example, a structure of a top-gate transistor to which the insulating film of one embodiment of the present invention is applied will be described.

Figure 2A:
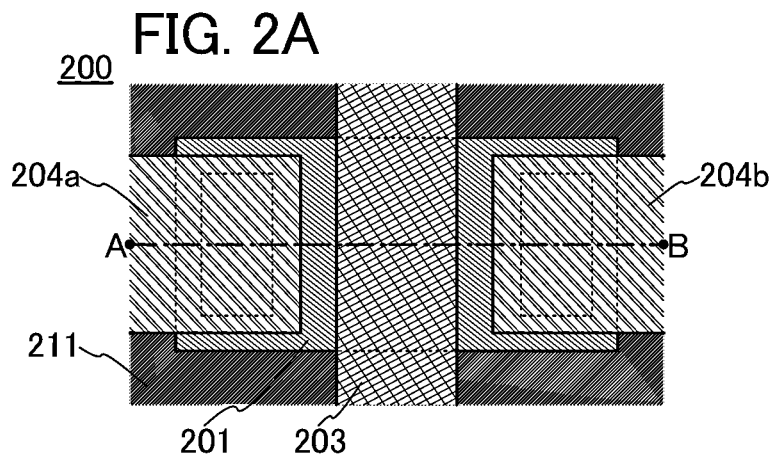
FIGS. 2A to 2C each illustrate a semiconductor device of one embodiment of the present invention.
Figure 2B:
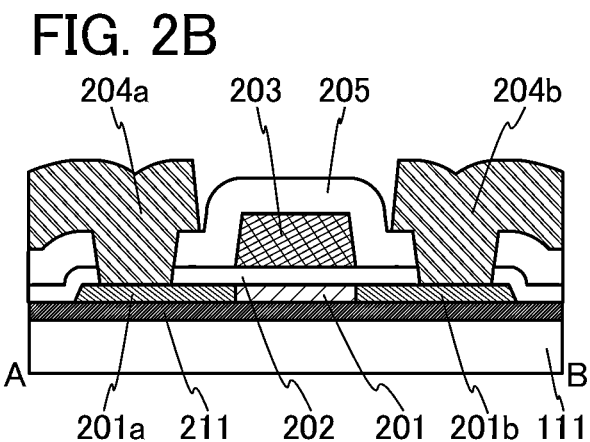

FIG. 2A is a schematic top view of a transistor 200 of one embodiment of the present invention. FIG. 2B is a schematic cross-sectional view along line A-B in FIG. 2A. Note that some components (e.g., a gate insulating layer) are not illustrated in FIG. 2A for simplicity.

The transistor 200 includes a semiconductor layer 201 including regions 201a and 201b having reduced resistance, which is in contact with the top surface of an insulating layer 211 provided over the substrate 111; a gate insulating layer 202 covering the semiconductor layer 201; a gate electrode layer 203 which is in contact with the top surface of the gate insulating layer 202 and overlaps with the semiconductor layer 201; an insulating layer 205 covering the gate insulating layer 202 and the gate electrode layer 203; and a source electrode layer 204a and a drain electrode layer 204b each of which is electrically connected to the semiconductor layer 201 through an opening portion provided in part of the insulating layer 205 and the gate insulating layer 202.

Here, the insulating film 101 of one embodiment of the present invention described in Embodiment 1 as an example is applied to the insulating layer 211 in contact with the semiconductor layer 201.

A region of the semiconductor layer 201 which overlaps with the gate electrode layer 203 functions as an active layer in which a channel is formed. In regions of the semiconductor layer 201 which do not overlap with the gate electrode layer 203, the regions 201a and 201b having reduced resistance are formed by, for example, addition of impurities. Accordingly, the contact resistance of the semiconductor layer 201 with the source electrode layer 204a and the drain electrode layer 204b is reduced. Since the resistance of the region which does not overlap with the gate electrode layer 203 is reduced, the resistance between the source and the drain is reduced and the electrical characteristics such as the on-state current are improved.

Then, an oxide semiconductor film applicable to the semiconductor layer 201 will be described.

The oxide semiconductor film can be in a single crystal state, a polycrystalline (also referred to as polycrystal) state, an amorphous state, or the like.

A c-axis aligned crystalline oxide semiconductor (CAAC-OS) film is preferably used as the oxide semiconductor film.

The CAAC-OS film is not completely single crystal nor completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned with a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

In an oxide semiconductor having crystallinity (crystalline oxide semiconductor), defects in the bulk can be further reduced. Further, when planarity of the surface of the crystalline oxide semiconductor film is enhanced, a top-gate transistor including such an oxide semiconductor can obtain higher field-effect mobility than a transistor including an amorphous oxide semiconductor. To enhance the surface planarity of the oxide semiconductor film, the oxide semiconductor is preferably formed over a flat surface. Specifically, the oxide semiconductor is preferably formed over a surface with an average surface roughness ($R_a$) less than or equal to 0.15 nm, preferably less than or equal to 0.1 nm.

Note that $R_a$ is obtained by expanding arithmetic mean deviation, which is defined by JIS B 0601, into three dimensions so as to be applicable to a surface. Moreover, $R_a$ can be expressed as average value of the absolute values of deviations from a reference surface to a specific surface and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. Note that $R_a$ can be measured using an atomic force microscope (AFM).

An oxide semiconductor used for the oxide semiconductor film preferably contains at least indium (In) or zinc (Zn). In particular, In and Zn are preferably contained. As a stabilizer for reducing variation in electric characteristics of a transistor using the oxide semiconductor film, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and an lanthanoid element (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Further alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio where In:Ga:Zn=1:1:1, In:Ga:Zn=3:1:2, or In:Ga:Zn=2:1:3, or any of oxides whose composition is in the neighborhood of the above compositions can be used.

The above is a description of the oxide semiconductor film applicable to the semiconductor layer 201.

The insulating layer 211 which is in contact with the semiconductor layer 201 is provided over the substrate 111. The insulating film 101 described in Embodiment 1 as an example can be applied to the insulating layer 211. When the insulating layer 211 and the semiconductor layer 201 are provided in contact with each other as described above, oxygen can be effectively supplied to the semiconductor layer 201 by heat treatment.

Figure 2C:
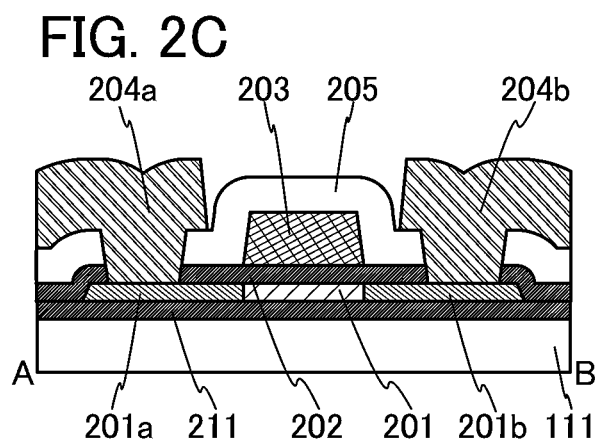

As illustrated in FIG. 2C, the insulating film 101 described in Embodiment 1 as an example can be applied also to the gate insulating layer 202. When the semiconductor layer 201 is sandwiched between insulating layers to each of which the insulating film 101 is applied, oxygen can be supplied to the semiconductor layer 201 more effectively. Although a structure in which the insulating film 101 is applied to both the insulating layer 211 and the gate insulating layer 202 is illustrated in FIG. 2C, the insulating film 101 can be applied to only the gate insulating layer 202.

It is preferable that a layer formed of a material having a high barrier property against oxygen be provided on the far side of the insulating layer to which the insulating film 101 is applied from the semiconductor layer 201. For example, such a layer is preferably provided between the substrate 111 and the insulating layer 211. In the case where the insulating film 101 is applied to the gate insulating layer 202, a material having a bather property against oxygen is used for the insulating layer 205. With such a structure, oxygen released from the insulating film 101 is prevented from diffusing into the side opposite to the semiconductor layer 201, whereby oxygen can be supplied to the semiconductor layer 201 more effectively.

As such an insulating film having a barrier property against oxygen, a silicon nitride film, a silicon nitride oxide film, an aluminum nitride film, an aluminum oxide film, an aluminum oxynitride film, an aluminum nitride oxide film, or the like can be used.

The above is a description of the transistor 200 described in this structural example.

Manufacturing Process Example 1

An example of a manufacturing process of the transistor 200 described in Structural Example 1 will be described below with reference to the drawings. FIGS. 3A to 3D are schematic cross-sectional views illustrating an example of a manufacturing process of the transistor 200.

First, the substrate 111 is prepared. Although there is no particular limitation on a substrate that can be used as the substrate 111, it is necessary that the substrate have heat resistance to withstand at least a heat treatment performed later. For example, a glass substrate such as a barium borosilicate glass substrate or an aluminoborosilicate glass substrate, a ceramic substrate, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used.

A flexible substrate may be used as the substrate 111. In the case of using a flexible substrate, a transistor including an oxide semiconductor may be directly formed over the flexible substrate. Alternatively, a transistor including an oxide semiconductor may be formed over a different substrate, and then, the transistor may be separated from the different substrate to be transferred to a flexible substrate. In order that the transistor be separated from the different substrate to be transferred to the flexible substrate, it is preferable to provide a separation layer between the manufacturing substrate and the transistor including an oxide semiconductor.

The insulating film having a barrier property against oxygen may be formed over the substrate 111. The insulating film can be formed by a sputtering method or a CVD method. The insulating film is preferably formed in an atmosphere in which impurities such as hydrogen are contained as little as possible. In addition, heat treatment is preferably performed after the insulating film is formed for dehydrogenation.

Next, the insulating layer 211 is formed over the substrate 111. The insulating layer 211 can be formed by the method for forming the insulating film 101 described in Embodiment 1 as an example.

After that, an oxide semiconductor film is formed over the insulating layer 211 and then is processed into an island shape by a photolithography method to form the semiconductor layer 201. The oxide semiconductor film is preferably a CAAC-OS film. Note that the insulating layer 211 and the oxide semiconductor film are preferably formed successively without exposure to the air.

In a formation step of the oxide semiconductor film, it is preferable that hydrogen or water be contained in the oxide semiconductor film as little as possible. For example, it is preferable that the substrate 111 on which the insulating layer 211 is already formed be preheated in a preheating chamber of a sputtering apparatus as pretreatment for formation of the oxide semiconductor film so that impurities such as hydrogen or moisture adsorbed to the substrate 111 and the insulating layer 211 are removed and evacuated. Then, the oxide semiconductor film is preferably formed in a deposition chamber from which remaining moisture is removed.

To remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which is evacuated with a cryopump, a hydrogen atom, a compound containing a hydrogen atom such as water ($H_2O$) (more preferably, also a compound containing a carbon atom), and the like are removed, whereby the concentration of impurities such as hydrogen or moisture in the oxide semiconductor film that is to be formed can be reduced.

Note that in this embodiment, an In—Ga—Zn-based oxide film is deposited as the oxide semiconductor film by a sputtering method. The oxide semiconductor film can be formed by a sputtering method in a rare gas (typically argon) atmosphere, an oxygen atmosphere, or a mixed atmosphere of a rare gas and oxygen.

As a target used for forming an In—Ga—Zn-based oxide film as the oxide semiconductor film by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film is not limited to the above.

Further, when the oxide semiconductor film is formed using the above metal oxide target, the composition of the target is different from the composition of a film formed over the substrate in some cases. For example, when the metal oxide target having a molar ratio where $In_2O_3:Ga_2O_3:ZnO=1:1:1$ is used, the composition of the thin oxide semiconductor film becomes $In_2O_3:Ga_2O_3:ZnO=1:1:0.6$ to $1:1:0.8$ [molar ratio] in some cases, though it depends on the film formation conditions. This is because in formation of the oxide semiconductor film, ZnO is sublimed, or because a sputtering rate differs between the components of $In_2O_3$, $Ga_2O_3$, and ZnO.

Accordingly, the composition of the metal oxide target needs to be adjusted in advance to form a thin film having preferable composition. For example, in order to make the composition of the thin oxide semiconductor film be $In_2O_3:Ga_2O_3:ZnO=1:1:1$ [molar ratio], the composition of the metal oxide target is made to be $In_2O_3:Ga_2O_3:ZnO=1:1:1.5$ [molar ratio], for instance. In other words, the ZnO content of the metal oxide target is made higher in advance. The composition of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is higher than or equal to 90% and lower than or equal to 100%, preferably higher than or equal to 95% and lower than or equal to 99.9%. By using the metal oxide target with high relative density, a dense oxide semiconductor film can be formed.

It is important to use a high-purity metal oxide target. For example, the purity of the metal oxide target is greater than or equal to 6N (99.9999%), preferably greater than or equal to 7N (99.99999%), further preferably greater than or equal to 8N (99.999999%).

As a sputtering gas used for forming the oxide semiconductor film, it is preferable to use a high-purity gas from which impurities such as hydrogen, water, hydroxyl groups, or hydrides are removed.

There are three methods for forming a CAAC-OS film when the CAAC-OS film is used as the oxide semiconductor film.

The first method is to form an oxide semiconductor film at a temperature higher than or equal to 200° C. and lower than or equal to 450° C. to form, in the oxide semiconductor film, crystal portions in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal portions in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal portions in which the c-axes are aligned in the direction parallel to a normal vector of a surface where the oxide semiconductor film is formed or a normal vector of a surface of the oxide semiconductor film.

By heating the substrate 111 during film formation, the concentration of impurities such as hydrogen or water in the oxide semiconductor film can be reduced. In addition, damage by sputtering can be reduced, which is preferable.

Note that when a crystalline (single-crystal or microcrystalline) oxide semiconductor film other than a CAAC-OS film is formed as the oxide semiconductor film, the deposition temperature and the temperature of heat treatment are not particularly limited.

In this manufacturing process example, the oxide semiconductor film is formed at a temperature lower than a temperature range in which oxygen is supplied from the insulating layer 211 by heat treatment performed later, preferably lower than or equal to 500° C., further preferably lower than or equal to 400° C. In particular, in the case where a large-sized substrate is used, the oxide semiconductor film is preferably formed at low temperatures because problem such as misalignment of a pattern due to the thermal expansion of the substrate, a crack, peeling of a film, or a fracture in the substrate becomes significant when the substrate temperature is increased.

Next, the gate insulating layer 202 is formed. The gate insulating layer 202 can have a thickness of greater than or equal to 1 nm and less than or equal to 500 nm, for example. There is no particular limitation on the method for forming the gate insulating layer 202; for example, a sputtering method, an MBE method, a CVD method, a pulse laser deposition method, an ALD method, or the like can be used as appropriate for formation of the gate insulating layer 202.

The gate insulating layer 202 can be formed using silicon oxide, gallium oxide, aluminum oxide, silicon nitride, silicon oxynitride, aluminum oxynitride, silicon nitride oxide, or the like. The gate insulating layer 202 preferably contains oxygen in a portion which is in contact with the oxide semiconductor film. In particular, the gate insulating layer 202 preferably contains an amount of oxygen that exceeds at least the stoichiometric composition. For example, in the case where a silicon oxide film is used as the gate insulating layer 202, a film of $SiO_{2+\alpha}$ ($\alpha>0$) is preferably used. When such a silicon oxide film is used as the gate insulating layer 202, oxygen can be supplied to the oxide semiconductor film, leading to favorable electrical characteristics.

The gate insulating layer 202 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Further, the gate insulating layer 202 may have a single-layer structure or a stacked-layer structure.

The insulating film 101 described in Embodiment 1 as an example is preferably applied to the gate insulating layer 202. In that case, the gate insulating layer 202 can be formed by the formation method described in Embodiment 1 as an example.

Figure 3A:
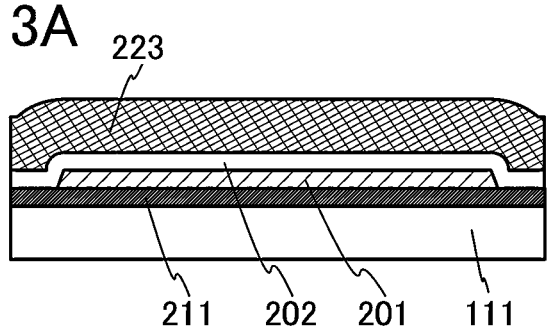
FIGS. 3A to 3D illustrate a method for manufacturing a semiconductor device of one embodiment of the present invention.

Then, a conductive film 223 which is to be the gate electrode layer 203 is formed over the gate insulating layer 202 (FIG. 3A). As examples of a material used for the conductive film 223, for example, metal materials such as molybdenum, titanium, tantalum, tungsten, aluminum, copper, neodymium, and scandium and an alloy material containing any of these metal materials as its main component can be given. Alternatively, a conductive metal oxide can be used for the conductive film 223. As the conductive metal oxide, an indium oxide ($In_2O_3$), a tin oxide ($SnO_2$), a zinc oxide (ZnO), an indium tin oxide ($In_2O_3$—$SnO_2$), an indium zinc oxide ($In_2O_3$—ZnO), or any of these metal oxide materials in which silicon or a silicon oxide is included can be used. The conductive film 223 can be formed to have a single-layer structure or a stacked-layer structure using any of the above-described materials. There is no particular limitation on the formation method, and a variety of formation methods such as an evaporation method, a CVD method, a sputtering method, and a spin coating method can be employed.

Next, the conductive film 223 is selectively etched by a photolithography method to form the gate electrode layer 203.

Figure 3B:
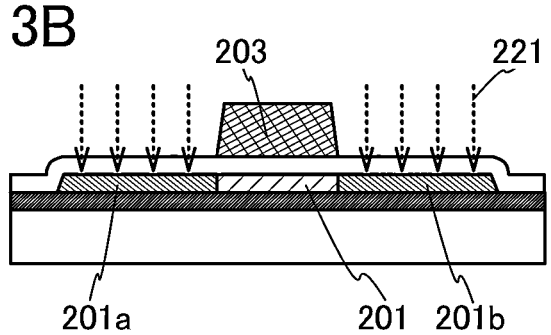

After that, a dopant 221 is introduced into the semiconductor layer 201 through the gate insulating layer 202 using the gate electrode layer 203 as a mask to form the regions 201a and 201b which function as a pair of low-resistance regions (FIG. 3B).

The dopant 221 is an impurity by which the electrical conductivity of the oxide semiconductor film is changed. One or more selected from the following can be used as the dopant 221: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (CO, titanium (Ti), and zinc (Zn).

As a method for introducing the dopant 221, an ion implantation method, an ion doping method, a plasma immersion ion implantation method, or the like can be used. In that case, it is preferable to use a single ion of the dopant 221, or a fluoride ion or a chloride ion thereof.

The introduction step of the dopant 221 may be controlled by setting the addition conditions such as the accelerated voltage and the dosage, or the thickness of the film through which the dopant passes as appropriate. For example, phosphorus is used as the dopant 221, whose ion is added by an ion implantation method. At this time, the dosage of the dopant 221 is preferably set to be greater than or equal to $1\times10^{13}$ ions/cm$^2$ and less than or equal to $5\times10^{16}$ ions/cm$^2$.

The concentration of the dopant 221 introduced into the low-resistance regions is preferably higher than or equal to $5\times10^{18}$/cm$^3$ and lower than or equal to $1\times10^{22}$/cm$^3$.

The dopant 221 may be introduced with the substrate 111 heated.

The introduction of the dopant 221 into the semiconductor layer 201 may be performed plural times, and the number of kinds of the dopant 221 may be plural.

Further, heat treatment may be performed thereon after the introduction of the dopant 221. The heat treatment is preferably performed at a temperature higher than or equal to 300° C. and lower than or equal to 700° C., more preferably higher than or equal to 300° C. and lower than or equal to 450° C., in an oxygen atmosphere for one hour. The heat treatment may be performed under a nitrogen atmosphere, reduced pressure, or the air (ultra-dry air).

The heat treatment at this point may also serve as heat treatment for supplying oxygen from the insulating layer 211 to the semiconductor layer 201. The heat treatment for supplying oxygen will be described later.

In the case where the oxide semiconductor film is a crystalline oxide semiconductor film or a CAAC-OS film, part of the oxide semiconductor film becomes amorphous due to the introduction of the dopant 221 in some cases. In that case, the crystallinity of the oxide semiconductor film can be recovered by performing heat treatment thereon after the introduction of the dopant 221.

By such an introduction step of the dopant 221, the semiconductor layer 201 in which a region functioning as a channel formation region is provided between the regions 201a and 201b functioning as the low-resistance regions is formed.

Figure 3C:
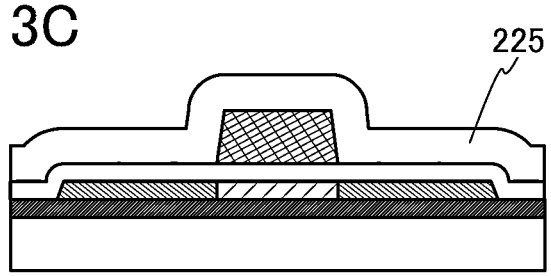

Subsequently, an insulating film 225 which is to be the insulating layer 205 is formed to cover the gate insulating layer 202 and the gate electrode layer 203 (FIG. 3C).

The insulating film 225 is preferably formed using an inorganic insulating film to have a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, as a stacked layer, a silicon oxide film and an aluminum oxide film are deposited in this order over the gate electrode layer 203.

A planarization insulating film may be provided over the insulating film 225. The planarization insulating film can be formed using an organic material having heat resistance, such as, an acrylic resin, a polyimide resin, or a benzocyclobutene-based resin, a polyamide resin, or an epoxy resin can be used. Other than such organic materials, a low-dielectric constant material (low-k material) or a siloxane-based resin can be used. Note that the planarizing insulating film may be formed by stacking a plurality of insulating films formed of any of these materials.

Here, the heat treatment for supplying oxygen from the insulating layer 211, to which the insulating film 101 described in Embodiment 1 as an example, is applied to the semiconductor layer 201 is performed.

The heat treatment is performed at temperatures at which atoms in the insulating layer 211 are rearranged and lower than the strain point of the substrate 111, preferably higher than or equal to 350° C., further preferably higher than or equal to 400° C.

By the heat treatment, oxygen released from the insulating layer 211 is supplied to the semiconductor layer 201 in contact with the insulating layer 211. Thus, oxygen vacancies in the oxide semiconductor film which forms the semiconductor layer 201 can be filled. When oxygen is supplied with the semiconductor layer 201 heated as described above, rearrangement of atoms in the oxide semiconductor film is promoted and the oxygen vacancies can be filled more effectively.

Note that it is preferable that the temperature of this heat treatment be the highest in steps after the formation of the oxide semiconductor film. When heat treatment at a temperature further higher than the above heat treatment is performed after the above heat treatment, oxygen supplied to the semiconductor layer 201 might be eliminated.

The insulating layer 211 after the heat treatment has higher crystallinity and a higher film density as compared with those before the heat treatment in some cases. For example, the crystallinity of the insulating layer 211 can be increased to the level that part or all of the insulating film 101 is completely crystallized and a grain boundary is observed in an observation image of a cross section of the insulating layer 211. The higher the temperature of the heat treatment is, the more the crystallization proceeds.

Since the crystallinity of the insulating film 101 in contact with the oxide semiconductor film is increased by the heat treatment as described above, a barrier property against impurities such as water and hydrogen is increased; thus, the insulating layer 211 also functions as a barrier film for preventing diffusion of impurities into the oxide semiconductor film. In addition, when the crystallinity is increased, the insulating layer 211 can have a barrier property against oxygen, so that there is an effect of preventing oxygen which is supplied to the oxide semiconductor film by the heat treatment from being eliminated through the insulating film 101.

The heat treatment can be performed in such a manner that, for example, an object of the heat treatment is introduced into an electric furnace in which a resistance heating element or the like is used and heated in an inert gas atmosphere or an atmosphere containing oxygen. Note that entry of water or hydrogen into an atmosphere used for the heat treatment is prevented as far as possible.

An apparatus used for the heat treatment is not limited to the electric furnace and may be an apparatus for heating an object to be processed by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA process may be performed as follows. The object to be processed is introduced into a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas containing oxygen during the process.

Although a method in which the heat treatment is performed after the insulating film 225 is formed is described in this manufacturing process example, the present invention is not limited thereto. The heat treatment can be performed at any time at least after the insulating layer to which the insulating film of one embodiment of the present invention is applied and the oxide semiconductor film in contact with the insulating film are formed. For example, the heat treatment may be performed before the oxide semiconductor film is processed into the island-shaped semiconductor layer 201.

Next, the opening portions which reach the respective regions 201a and 201b in the semiconductor layer 201 are formed in the insulating film 225 and the gate insulating layer 202 by a photolithography method.

Figure 3D:
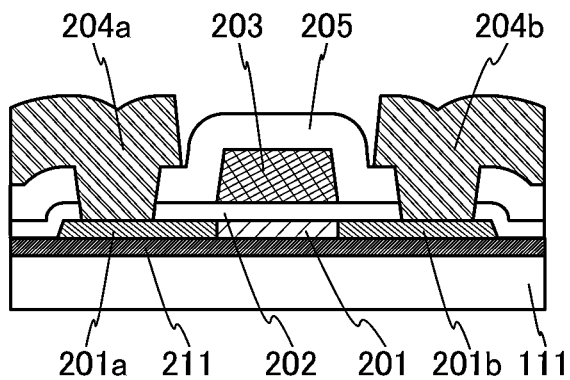

After that, a conductive film (not illustrated) which is to be the source electrode layer 204a and the drain electrode layer 204b is formed. Subsequently, the conductive film is selectively etched by a photolithography method to form the source electrode layer 204a and the drain electrode layer 204b (FIG. 3D).

As the conductive film described above, for example, a metal film containing an element selected from aluminum, chromium, copper, tantalum, titanium, molybdenum, or tungsten, or a metal nitride film containing any of the above elements as its component (a titanium nitride film, a molybdenum nitride film, or a tungsten nitride film) can be used. Alternatively, the conductive film may have a structure in which a film of a high-melting-point metal such as titanium, molybdenum, or tungsten, or a metal nitride film of any of these metals (a titanium nitride film, a molybdenum nitride film, or a tungsten nitride film) is stacked on either or both the bottom surface and the top surface of a metal film of aluminum, copper, or the like. Further alternatively, the conductive film to be used as the source electrode and the drain electrode may be formed using a conductive metal oxide. As the conductive metal oxide, an indium oxide ($In_2O_3$), a tin oxide ($SnO_2$), a zinc oxide (ZnO), an indium tin oxide ($In_2O_3$—$SnO_2$), or an indium zinc oxide ($In_2O_3$—ZnO) can be used. The conductive film 224 can be formed to have a single-layer structure or a stacked-layer structure using any of the above-described materials. There is no particular limitation on the method for forming the conductive film, and a variety of film formation methods such as an evaporation method, a CVD method, a sputtering method, or a spin coating method can be employed.

Through the above-described steps, the transistor 200 can be manufactured.

Note that the oxide semiconductor film or the island-shaped semiconductor layer 201 may be subjected to heat treatment in an inert gas atmosphere after the oxide semiconductor film is formed. By the heat treatment, excessive hydrogen can be removed. In this specification and the like, the heat treatment is referred to as dehydration treatment (dehydrogenation treatment) in some cases.

The heat treatment is performed at a temperature in a range of from 300° C. to 700° C. It is preferable that the heat treatment be performed at a temperature lower than the above-described heat treatment for supplying oxygen from the insulating layer 211 to the semiconductor layer 201.

Here, as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The dehydration treatment (dehydrogenation treatment) may be accompanied by elimination of oxygen which is a main component material for an oxide semiconductor film to lead to a reduction in oxygen. An oxygen vacancy exists in a portion where oxygen is eliminated in an oxide semiconductor film, and a donor level which leads to a change in electrical characteristics of a transistor is formed owing to the oxygen vacancy. Thus, it is further effective that the above-described heat treatment for supplying oxygen is performed after the dehydration treatment (dehydrogenation treatment).

Further, when a method for supplying oxygen as described below is employed in addition to the above-described heat treatment for supplying oxygen, a highly reliable transistor can be obtained.

The oxygen vacancy in the oxide semiconductor film may be filled in the following manner, for example: after the oxide semiconductor film is subjected to the dehydration treatment (dehydrogenation treatment), a high-purity oxygen gas, a high-purity dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace. It is preferable that the oxygen gas or the dinitrogen monoxide gas do not contain water, hydrogen, and the like. Alternatively, the purity of the oxygen gas or the dinitrogen monoxide gas which is introduced into the heat treatment apparatus is preferably 6N (99.9999%) or higher, further preferably 7N (99.99999%) or higher (i.e., the impurity concentration in the oxygen gas or the dinitrogen monoxide gas is preferably 1 ppm or lower, further preferably 0.1 ppm or lower).

As another example of a method for filling oxygen vacancy in the oxide semiconductor film, oxygen (including at least any of oxygen radicals, oxygen atoms, and oxygen ions) may be added to the oxide semiconductor film to supply oxygen to the oxide semiconductor film. An ion implantation method, an ion doping method, a plasma immersion ion implantation method, plasma treatment, or the like can be used as a method for adding oxygen.

As described above, after formation of the oxide semiconductor film, it is preferable that dehydration treatment (dehydrogenation treatment) be performed to remove hydrogen or moisture from the oxide semiconductor film, so that the oxide semiconductor film is highly purified so as to include as few impurities as possible, and oxygen whose amount is reduced in the dehydration treatment (dehydrogenation treatment) be added to the oxide semiconductor or oxygen be supplied excessively to fill the oxygen vacancies in the oxide semiconductor film. In this specification and the like, supplying oxygen to the oxide semiconductor film may be expressed as oxygen adding treatment or oxygen supplying treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. The oxide semiconductor film formed in such a manner includes extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$, still further preferably lower than $1.45\times10^{10}/cm^3$.

The transistor including the oxide semiconductor layer which is highly purified by sufficiently reducing the hydrogen concentration, and in which defect levels in the energy gap due to oxygen vacancies are reduced by sufficiently supplying oxygen can achieve excellent off-state current characteristics. For example, the off-state current (per unit channel width (1 μm) here) at room temperature (25° C.) is 100 zA/μm (1 zA (zeptoampere) is $1\times10^{-21}$ A) or less, preferably 10 zA/μm or less. The off-state current at 85° C. is 100 zA/μm ($1\times10^{-19}$ A/μm) or less, preferably 10 zA/μm ($1\times10^{-20}$ A/μn) or less. In this manner, the transistor which has extremely favorable off-state current characteristics can be obtained with the use of an i-type (intrinsic) or substantially i-type oxide semiconductor layer.

The above is a description of the example of a manufacturing process of a top-gate transistor described in this manufacturing process example.

Structural Example 2

In this structural example, a structural example of a bottom-gate transistor to which the insulating film of one embodiment of the present invention is applied will be described.

Note that in this structural example, a description that overlaps with the portions described in the above structural example is omitted or is simply given.

Figure 4A:
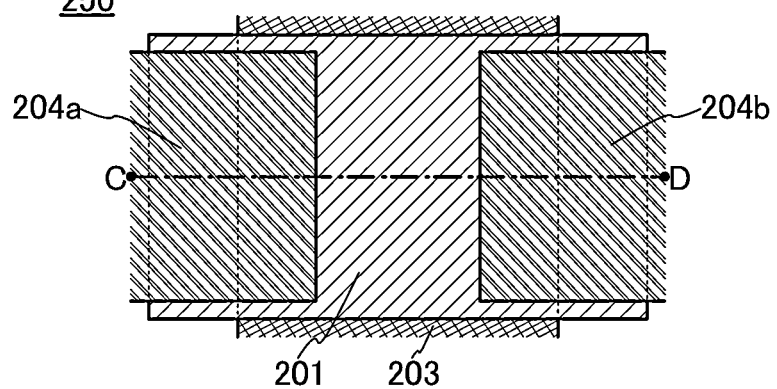
FIGS. 4A to 4C each illustrate a semiconductor device of one embodiment of the present invention.
Figure 4B:
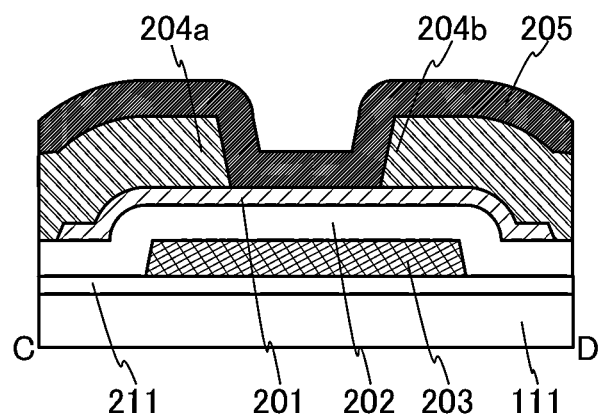

FIG. 4A is a schematic top view of a transistor 250 of one embodiment of the present invention. FIG. 4B is a schematic cross-sectional view along line C-D in FIG. 4A. Note that some components (e.g., the insulating layer 205) are not illustrated in FIG. 4A for simplicity.

The transistor 250 includes the gate electrode layer 203 provided over the top surface of the insulating layer 211 over the substrate 111; the gate insulating layer 202 covering the gate electrode layer 203; the semiconductor layer 201 which partly overlaps with the gate electrode layer 203 and is over the gate insulating layer 202; the source electrode layer 204a and the drain electrode layer 204b formed over the semiconductor layer 201, each of which is electrically connected to the semiconductor layer 201; and the insulating layer 205 which covers the semiconductor layer 201, the source electrode layer 204a, and the drain electrode layer 204b and is in contact with an exposed region of the semiconductor layer 201.

Here, the insulating film of one embodiment of the present invention is applied to the insulating layer 205 in contact with the semiconductor layer 201.

A region of the semiconductor layer 201 which overlaps with the gate electrode layer 203 functions as an active layer in which a channel is formed. Further, as illustrated in FIG. 4B, when the source electrode layer 204a and the drain electrode layer 204b are provided so as to overlap with the gate electrode layer 203, on-state current can be increased without provision of a low-resistance region in the semiconductor layer 201. Note that low-resistance regions may be provided in regions of the semiconductor layer 201 which are in contact with the source electrode layer 204a or the drain electrode layer 204b. Even if low-resistance regions are not intentionally provided, in some cases, resistances in regions of the semiconductor layer 201 which are in contact with the source electrode layer 204a or the drain electrode layer 204b and the vicinities of the regions are lower than that in the other region.

When the insulating film of one embodiment of the present invention is applied to the insulating layer 205 in contact with the semiconductor layer 201, oxygen can be effectively supplied to the semiconductor layer 201 in the method for forming the transistor 250; thus, oxygen vacancies can be reduced and the transistor 250 with excellent electrical characteristics can be obtained.

Figure 4C:
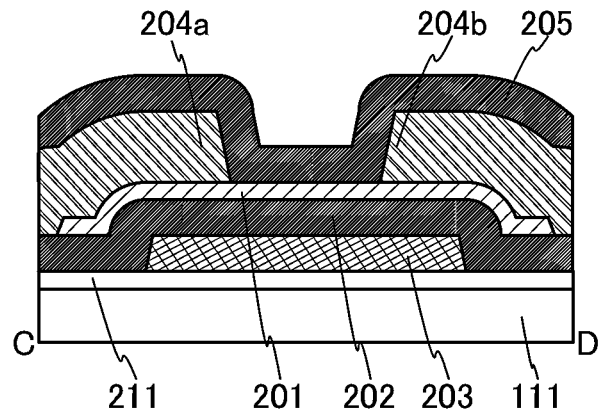

Although the case where the insulating film of one embodiment of the present invention is applied to the insulating layer 205 is described here, the insulating film of one embodiment of the present invention may be applied also to the gate insulating layer 202 as illustrated in FIG. 4C. The insulating film of one embodiment of the present invention can be applied also to the insulating layer 211 over the substrate 111.

Further, an insulating film having a high bather property against oxygen may be formed over the insulating layer 205.

The transistor 250 is what is called a channel-etched type transistor, in which the top surface of the semiconductor layer 201 is partly etched at the time of forming the source electrode layer 204a and the drain electrode layer 204b by etching during manufacturing process of the transistor. Such a channel-etched type transistor is preferable because the number of photomasks used for manufacture can be reduced, which can lead to the simplification of the process.

The transistor 250 may be what is called a channel-stop type (also referred to as channel-protective type) transistor in which an insulating layer serving as an etching protective layer is provided over the top surface of the semiconductor layer 201 so that the top surface of the semiconductor layer 201 is not etched at the time of forming the source electrode layer 204a and the drain electrode layer 204b by etching.

Figure 5A:
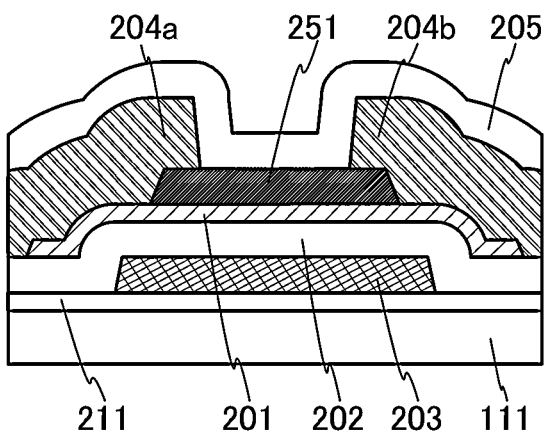
FIGS. 5A and 5B each illustrate a semiconductor device of one embodiment of the present invention.

A transistor 260 illustrated in FIG. 5A is a channel-stop type transistor including an insulating layer 251 which is provided between the semiconductor layer 201 and the source and drain electrode layers 204a and 204b, is in contact with the top surface of the semiconductor layer 201, and overlaps with an end portion of each of the source electrode layer 204a and the drain electrode layer 204b.

Note that the insulating film of one embodiment of the present invention is applied to the insulating layer 251 in contact with the semiconductor layer 201. When heat treatment is performed after the insulating layer 251 is formed, oxygen can be supplied to at least a region of the semiconductor layer 201 where a channel is formed; thus, oxygen vacancies in the oxide semiconductor film can be filled and a transistor with excellent electrical characteristics can be obtained.

Figure 5B:
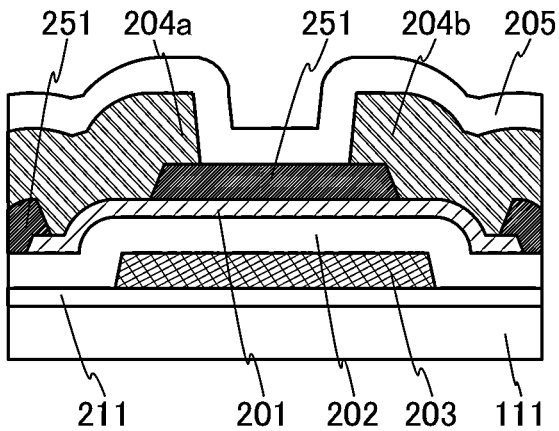

A transistor 270 illustrated in FIG. 5B is different from the transistor 260 in that the insulating layer 251 covers an end portion of the semiconductor layer 201.

In the case where the oxide semiconductor film used for the semiconductor layer 201 has crystallinity, oxygen vacancies are likely to be formed in the end portion of the semiconductor layer 201, particularly when the semiconductor layer 201 has a tapered end portion. As a result, unintended current might be generated owing to carriers which are generated in the end portion, which might adversely affect the electrical characteristics. With a structure in which the insulating layer 251 covers the end portion of the semiconductor layer 201, oxygen vacancies in the end portion can also be effectively filled; thus, the electrical characteristics of the transistor can be improved.

Further, when the insulating layer 251 is formed so as to cover a region excluding regions where opening portions for electrically connecting the semiconductor layer 201 to the source electrode layer 204a and the drain electrode layer 204b are to be formed, the area of a region where the semiconductor layer 201 is exposed after the insulating film forming the insulating layer 251 is formed can be minimized. Thus, an adverse effect such as unintended contamination on the semiconductor layer 201 in the manufacturing process can be reduced.

As in the case of the transistor 250, the insulating film of one embodiment of the present invention can be applied also to the gate insulating layers 202 and the insulating layers 211 in the transistor 260 and the transistor 270.

The above is a description of the bottom-gate transistor described in this manufacturing process example.

Manufacturing Process Example 2

An example of a manufacturing process of the bottom-gate transistor described in Structural Example 2 will be described in this manufacturing process example with reference to the drawings. Here, a method for manufacturing the transistor 270 will be described as an example. FIGS. 6A to 6D are schematic cross-sectional views illustrating an example of a manufacturing process of the transistor 270.

Note that in this structural example, a description that overlaps with the portions described in Manufacturing Process Example 1 is omitted or is simply given.

First, the insulating layer 211 is formed over the substrate 111.

The insulating layer 211 is provided for preventing diffusion of impurities such as hydrogen or moisture from the substrate 111 and formed using an inorganic insulating material. As examples of the inorganic insulating material used for the insulating layer 211, silicon oxide, silicon oxynitride, silicon nitride oxide, and the like can be given. The insulating layer 211 can be formed to have a single-layer structure or a stacked-layer structure using any of the above materials.

The insulating layer 211 is formed by a sputtering method or a CVD method, for example. It is preferable that the insulating layer 211 do not contain impurities such as hydrogen and water. Because of this, the above-described dehydration treatment or oxygen supplying treatment may be performed on the insulating layer 211. In particular, an insulating film formed by a CVD method might contain hydrogen, so that such treatment is particularly effective.

Plasma treatment or the like may be performed on the substrate 111 before the insulating layer 211 is formed. As plasma treatment, reverse sputtering in which an argon gas is introduced and plasma is generated can be performed, for example. The reverse sputtering is a method in which voltage is applied to the substrate 111 side with use of an RF power source under an argon atmosphere and plasma is generated near the substrate 111 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 111.

Next, a conductive film (not illustrated) which is to be the gate electrode layer 203 is formed over the insulating layer 211. Subsequently, the conductive film is selectively etched by a photolithography method to form the gate electrode layer 203.

Then, the gate insulating layer 202 covering the gate electrode layer 203 is formed.

The gate insulating layer 202 can be formed by the method described in Manufacturing Process Example 1. In the case where the insulating film of one embodiment of the present invention is applied to the gate insulating layer 202, the formation method described in Embodiment 1 as an example can be used.

Figure 6A:
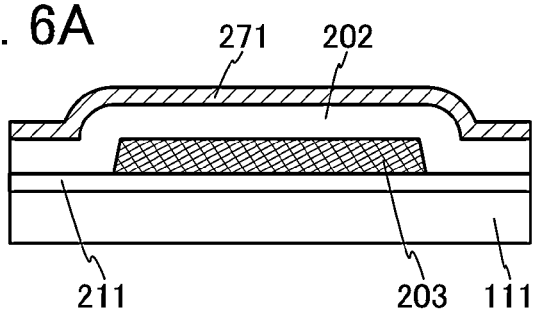
FIGS. 6A to 6D illustrate a method for manufacturing a semiconductor device of one embodiment of the present invention.

After that, an oxide semiconductor film 271 which is to be the semiconductor layer 201 is formed over the gate insulating layer 202 (FIG. 6A).

Then, the oxide semiconductor film 271 is selectively etched by a photolithography method to form the island-shaped semiconductor layer 201.

Figure 6B:
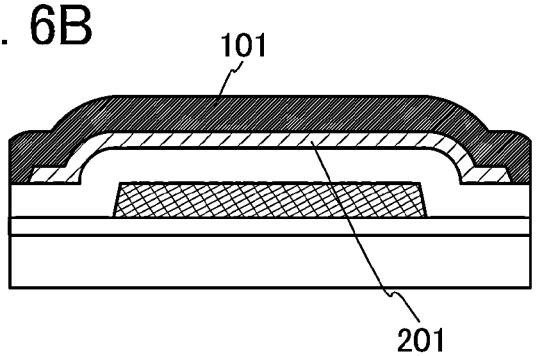

Next, the insulating film 101 is formed in contact with the semiconductor layer 201 (FIG. 6B). The insulating film 101 can be formed by the formation method described in Embodiment 1 as an example.

After the insulating film 101 is formed, heat treatment for supplying oxygen from the insulating film 101 to the semiconductor layer 201 is performed. By the heat treatment, oxygen is supplied to the semiconductor layer 201 and oxygen vacancies in the oxide semiconductor film which forms the semiconductor layer 201 can be effectively filled.

Then, the insulating film 101 is selectively etched by a photolithography method to form the insulating layer 251 having the opening portions which reach the semiconductor layer 201. At this time, the insulating layer 251 is formed to cover at least a region of the semiconductor layer 201 where a channel is formed and the end portions of the semiconductor layer 201.

Figure 6C:
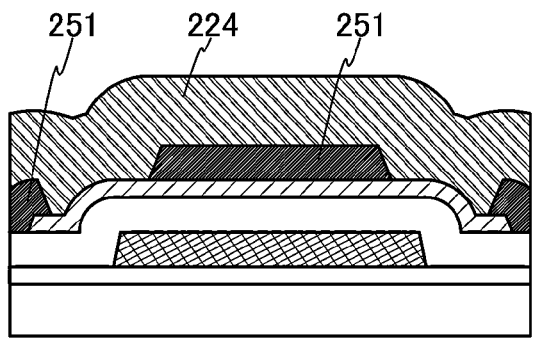

Next, the conductive film 224 which is to be the source electrode layer 204a and the drain electrode layer 204b is formed over the insulating layer 251 (FIG. 6C).

After that, the conductive film 224 is selectively etched by a photolithography method to form the source electrode layer 204a and the drain electrode layer 204b.

Note that since the top surface of the semiconductor layer 201 is protected by the insulating layer 251, the influence at the time of the etching of the conductive film 224 can be effectively suppressed. Unlike in a channel-etched type transistor, for example, the oxide semiconductor film 271 is not necessarily formed to be thick in advance in consideration of a reduction in the thickness of the semiconductor layer 201 by the etching, which is preferable. The provision of the insulating layer 251 is preferable particularly in the case where the amount of a reduction in the thickness varies within a substrate surface, e.g., the case of using a large-sized substrate, because variation in electrical characteristics of the transistor due to the distribution can be reduced.

Figure 6D:
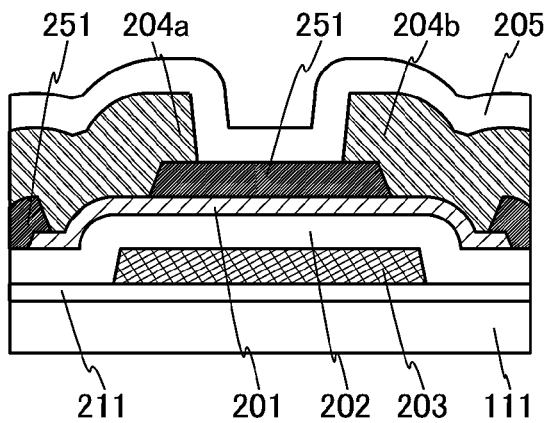

After the source electrode layer 204a and the drain electrode layer 204b are formed, the insulating layer 205 is formed to cover them (FIG. 6D).

Through the above-described steps, the transistor 270 can be manufactured.

In this manufacturing process example, the heat treatment for supplying oxygen from the insulating film of one embodiment of the present invention to the oxide semiconductor film is performed after the insulating film 101 which forms the insulating layer 251 is formed; however, the timing of the heat treatment is not limited thereto and the heat treatment may be performed at any stage after the oxide semiconductor film and the insulating film are formed. For example, in the case where the insulating film of one embodiment of the present invention is applied also to the gate insulating layer 202, heat treatment may be performed twice: after the oxide semiconductor film is formed, and after the insulating film 101 which forms the insulating layer 251 is formed.

In the case where dehydrogenation treatment and oxygen supplying treatment are performed on the oxide semiconductor film, the treatments may be performed at any stage after the oxide semiconductor film is formed. Note that the oxygen supplying treatment is preferably performed after the dehydrogenation treatment.

The transistor 260 illustrated in FIG. 5A can be manufactured when the pattern of the mask used for processing the insulating film 101 is changed as appropriate.

Further, when the step of forming the insulating layer 251 is skipped, the transistor 250 illustrated in FIG. 4B can be manufactured. In that case, the insulating film which forms the insulating layer 205 is formed by the method for forming the insulating film of one embodiment of the present invention. Note that the source electrode layer 204a and the drain electrode layer 204b are preferably formed by etching under etching conditions which are adjusted as appropriate so that the semiconductor layer 201 is not etched away.

The above is a description of the example of a manufacturing process of a bottom-gate transistor described in this manufacturing process example.

The transistors described in this embodiment as examples are highly reliable transistors having excellent electrical characteristics, in each of which the insulating film of one embodiment of the present invention is provided in contact with a semiconductor layer formed of an oxide semiconductor film, and oxygen is supplied from the insulating film by heat treatment in a manufacturing process of the transistor to effectively fill oxygen vacancies. Further, heat treatment for supplying oxygen from the insulating film of one embodiment of the present invention is performed at a temperature higher than any other steps of the manufacturing process, whereby supplied oxygen is prevented from being eliminated. Thus, a transistor including an oxide semiconductor film in which oxygen vacancies are sufficiently reduced can be manufactured.

In addition, any of the methods for manufacturing a transistor which are described in this embodiment can be applied to the case of using a large-sized substrate. Accordingly, the method can be applied to formation of a variety of thin film devices such as a display portion (including a pixel and a driver circuit) of a display device to which a display element such as a liquid crystal element or an organic EL (electroluminescent) element. Since the transistor formed by the method has favorable off-state current characteristics, power consumption of the device to which the transistor is applied can be effectively reduced.

This embodiment can be combined with any of the other embodiments and example described in this specification as appropriate.

Embodiment 3

In this embodiment, a semiconductor device suitable for miniaturization, to which the insulating film of one embodiment of the present invention is applied and a method for manufacturing the semiconductor device will be described with reference to the drawings.

Owing to its excellent electrical characteristics, a semiconductor device to which the insulating film of one embodiment of the present invention is applied and which includes an oxide semiconductor is applied can be used in a semiconductor circuit such as an integrated circuit (IC) or a central processing unit (CPU). The semiconductor device described in this embodiment as an example which includes an oxide semiconductor can be a miniaturized or a highly integrated semiconductor device and thus is particularly suitable for application to such a semiconductor circuit.

Structural Example 3

In this structural example, a structure of a top-gate transistor to which the insulating film of one embodiment of the present invention is applied and which allows high integration will be described.

Note that in this structural example, a description that overlaps with the portions described in the above structural example is omitted or is simply given.

Figure 7A:
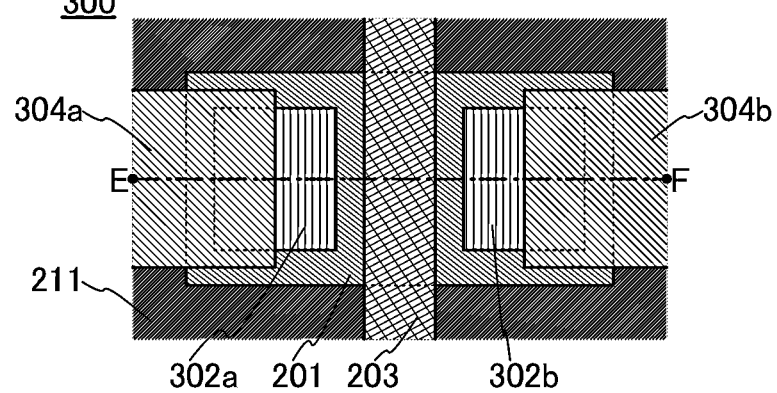
FIGS. 7A and 7B illustrate a semiconductor device of one embodiment of the present invention.
Figure 7B:
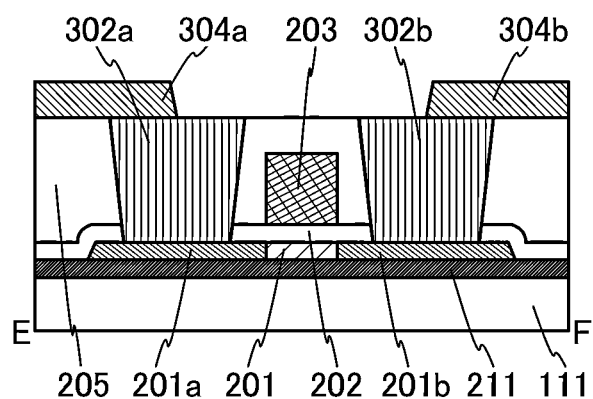

FIG. 7A is a schematic top view of a transistor 300 described in this structural example. FIG. 7B is a schematic cross-sectional view along line E-F in FIG. 7A. Note that some components (e.g., a gate insulating film) are not illustrated in FIG. 7A for simplicity.

The transistor 300 includes a semiconductor layer 201 including regions 201a and 201b having reduced resistance, which is in contact with the top surface of an insulating layer 211 provided over the substrate 111; a gate insulating layer 202 covering the semiconductor layer 201; a gate electrode layer 203 which is in contact with the top surface of the gate insulating layer 202 and overlaps with the semiconductor layer 201; an insulating layer 205 covering the gate insulating layer 202 and the gate electrode layer 203; contact plugs 302a and 302b each of which is electrically connected to the semiconductor layer 201 through an opening portion provided in the insulating layer 205 and the gate insulating layer 202; and a source wiring 304a and a drain wiring 304b electrically connected to the contact plugs 302a and 302b, respectively.

Here, the insulating film of one embodiment of the present invention is applied to the insulating layer 211 in contact with the semiconductor layer 201. Note that one embodiment of the present invention is not limited thereto and the insulating film can also be applied to the gate insulating layer 202 in contact with the semiconductor layer 201.

The top surfaces of the insulating layer 205 and the contact plugs 302a and 302b are planarized and the source wiring 304a and the drain wiring 304b are provided thereover.

Since the top surface of the transistor 300 is planarized as described above, another transistor 300 having the same structure can be stacked over a layer where the source wiring 304a and the drain wiring 304b are provided; thus, high integration can be achieved.

As described later, planarization treatment is performed to form the transistor 300, so that the process of manufacturing the transistor 300 is compatible with a process using single crystal silicon in which similar planarization treatment is performed. Thus, for example, a semiconductor circuit including the transistor 300 can be stacked over a semiconductor circuit including single crystal silicon.

When the insulating film of one embodiment of the present invention is applied to the insulating layer in contact with the semiconductor layer 201, oxygen can be effectively supplied to the semiconductor layer 201 in the method for forming the insulating film; thus, oxygen vacancies in the film can be reduced and the transistor 300 with excellent electrical characteristics can be obtained.

The above is a description of the transistor 300 described in this structural example.

Manufacturing Process Example 3

In this manufacturing process example, an example of a manufacturing process of the transistor described in Structural Example 3 will be described with reference to the drawings. FIGS. 8A to 8D are schematic cross-sectional views illustrating an example of a manufacturing process of the transistor 300.

Note that in this structural example, a description that overlaps with the portions described in the above manufacturing process example is omitted or is simply given.

First, the insulating layer 211 is formed over the substrate 111. Here, the insulating film of one embodiment of the present invention is applied to the insulating layer 211. The insulating layer 211 can be formed by the formation method described in Embodiment 1 as an example. Note that an insulating layer having a barrier property against oxygen and impurities such as hydrogen or moisture may be provided between the substrate 111 and the insulating layer 211.

In the case where the transistor 300 is formed as a miniaturized transistor, a substrate in which the degree of the thermal shrinkage due to heat treatment in the manufacturing process is relatively small is preferably used as the substrate 111. For example, a quartz substrate or a single crystal substrate of silicon or the like is preferably used. In the case of using a glass substrate, heat treatment at a temperature higher than or equal to temperatures applied in the manufacturing process is preferably performed in advance. As well as the substrates described in Embodiment 2 as examples, a substrate having an insulating surface over which a semiconductor circuit is formed can be used as the substrate 111. As examples of the substrate, a single crystal substrate of silicon and the like can be given.

Next, an oxide semiconductor film is formed in contact with the top surface of the insulating layer 211 and is selectively etched by a photolithography method to form the island-shaped semiconductor layer 201.

Then, the gate insulating layer 202 covering an exposed portion of the insulating layer 211 and the semiconductor layer 201 is formed.

Figure 8A:
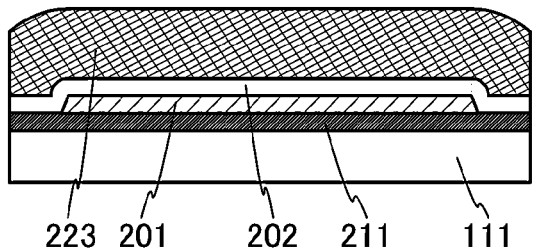
FIGS. 8A to 8D illustrate a method for manufacturing a semiconductor device of one embodiment of the present invention.

Subsequently, the conductive film 223 which is to be the gate electrode layer 203 is formed (FIG. 8A).

After that, the conductive film 223 is selectively etched by a photolithography method to form the gate electrode layer 203.

It is preferable to perform a slimming process on a mask used for the etching for the gate electrode layer 203, so that a mask can have a finer pattern. As the slimming process, an ashing process employing oxygen in a radical state (an oxygen radical) or the like can be employed, for example. Note that the slimming process is not limited to the ashing process as long as the mask formed by a photolithography method or the like can be processed into a finer pattern. Since the channel length of a transistor is determined by the mask formed by the slimming process, a process with high controllability is preferably employed. As a result of the slimming process, the width of the mask formed by a photolithography method or the like can be reduced to a length shorter than or equal to the resolution limit of a light exposure apparatus, preferably less than or equal to half of the resolution limit of a light exposure apparatus, and more preferably less than or equal to one third of the resolution limit of the light exposure apparatus. For example, the width of the formed mask can be greater than or equal to 30 nm and less than or equal to 2000 nm, preferably greater than or equal to 50 nm and less than or equal to 350 nm.

Figure 8B:
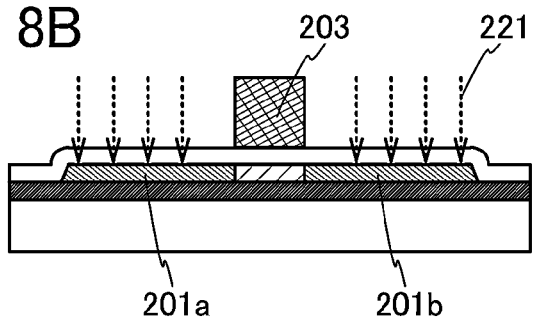

Then, the dopant 221 is introduced into the semiconductor layer 201 through the gate insulating layer 202 using the gate electrode layer 203 as a mask to form the regions 201a and 201b which function as a pair of low-resistance regions (FIG. 8B).

Here, heat treatment for supplying oxygen from the insulating layer 211 to the semiconductor layer 201 is performed. By the heat treatment, oxygen is supplied to the semiconductor layer 201 and oxygen vacancies in the oxide semiconductor film which forms the semiconductor layer 201 can be effectively filled.

When heat treatment is performed after the dopant 221 is introduced as described above, the heat treatment for supplying oxygen can also serve as heat treatment for activation of the dopant.

Subsequently, an insulating film 225 which is to be the insulating layer 205 is formed to cover the gate insulating layer 202 and the gate electrode layer 203. The insulating film 225 is formed to have an enough thickness, in consideration of a reduction in the thickness due to planarization treatment performed later.

Next, opening portions which reach the semiconductor layer 201 are formed in the insulating film 225 and the gate insulating layer 202.

When the two opening portions between which the gate electrode layer 203 is sandwiched are individually formed, the distance between the opening portions can be shorter than the resolution limit of a light exposure apparatus. For example, one of the opening portions is formed so as to as close to the gate electrode layer 203 as possible and then the other of the opening portions is formed so as to as close to the gate electrode layer 203 as possible in a similar manner. By making the distance between the opening portions shorter than the resolution limit of a light exposure apparatus by such a method, a transistor that can be further miniaturized can be formed particularly in the case where a slimming process is performed at the time of processing the gate electrode layer 203, because the width of the gate electrode layer 203 is smaller than the resolution limit of a light exposure apparatus.

Figure 8C:
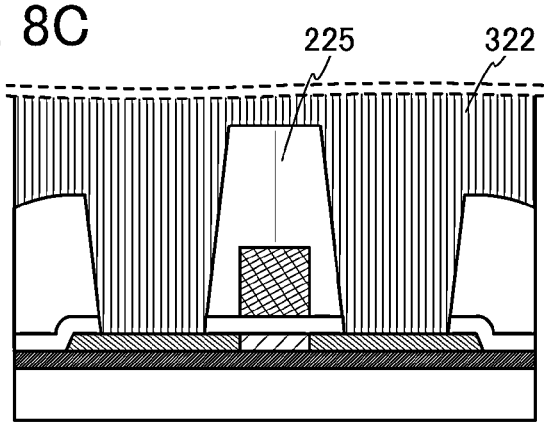

After that, a conductive film 322 which is to be the contact plug 302a and the contact plug 302b is formed over the insulating film 225 in which the opening portions are provided (FIG. 8C). In view of planarization treatment performed later, the conductive film 322 is formed thick enough to fill at least the opening portions. Note that part of an upper portion of the conductive film 322 is not illustrated in FIG. 8C.

The conductive film 322 can be formed using a material and a method which are similar to those of the conductive film which forms the gate electrode layer 203 or the conductive film which forms the source electrode layer 204a and the drain electrode layer 204b (the conductive film 223 or the conductive film 224).

Then, planarization treatment is performed on upper portions of the insulating film 225 and the conductive film 322. The planarization treatment is performed at least until the conductive film 322 is cut to form the contact plugs 302a and 302b which are electrically isolated from each other. The planarization treatment is preferably stopped in a state where the insulating film 225 is partially left over the gate electrode layer 203 so that the top surface of the gate electrode layer 203 is not exposed.

As the planarization treatment, etching treatment or chemical mechanical polishing (CMP) treatment can be performed. The CMP treatment is preferably performed plural times. For example, first polishing is performed with high polishing rate, followed by final polishing performed with low polishing rate. By performing polishing steps with different polishing rates in combination, the planarity can be increased.

By the planarization treatment, the insulating layer 205 and the contact plugs 302a and 302b are formed.

Figure 8D:
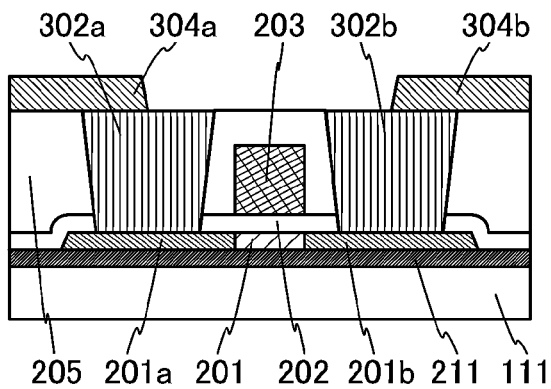

Next, the source wiring 304a and the drain wiring 304b which are electrically connected to the contact plugs 302a and 302b, respectively, are formed over the insulating layer 205 (FIG. 8D).

The source wiring 304a and the drain wiring 304b can be formed in such a manner that a conductive film is formed and selectively etched by a photolithography method. The conductive film can be formed using a material and a method which are similar to those of the conductive film which forms the gate electrode layer 203 or the conductive film which forms the source electrode layer 204a and the drain electrode layer 204b (the conductive film 223 or the conductive film 224).

Through the above-described steps, the transistor 300 can be manufactured.

In this manufacturing process example, the heat treatment for supplying oxygen from the insulating film of one embodiment of the present invention to the oxide semiconductor film is performed after the dopant 221 is introduced; however, the timing of the heat treatment is not limited thereto and the heat treatment may be performed at any stage after the oxide semiconductor film and the insulating film are formed. For example, in the case where the insulating film of one embodiment of the present invention is applied also to the gate insulating layer 202, heat treatment may be performed twice: after the oxide semiconductor film is formed, and after the gate insulating layer 202 is formed.

In the case where dehydrogenation treatment and oxygen supplying treatment are performed on the oxide semiconductor film, the treatments may be performed at any stage after the oxide semiconductor film is formed. Note that the oxygen supplying treatment is preferably performed after the dehydrogenation treatment.

The above is a description of the example of a manufacturing process of the transistor 300 described in this manufacturing process example.

Structural Example 4

In this structural example, a structure of a top-gate transistor which is different from that in Structural Example 3 will be described.

Note that in this structural example, a description that overlaps with the portions described in the above structural example is omitted or is simply given.

Figure 9A:
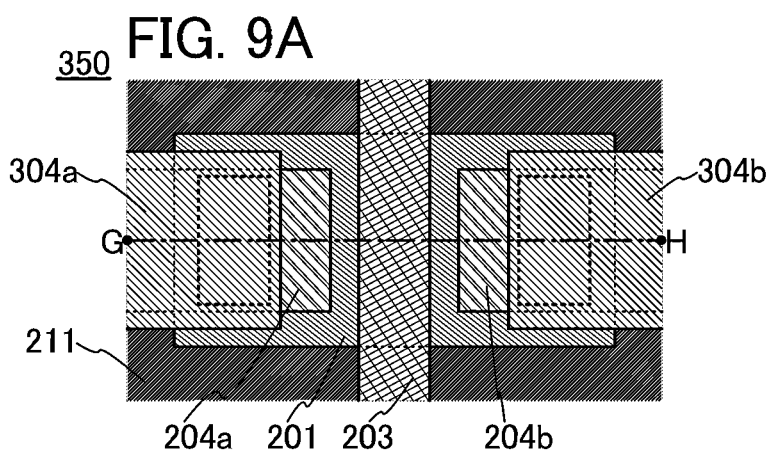
FIGS. 9A and 9B illustrate a semiconductor device of one embodiment of the present invention.
Figure 9B:
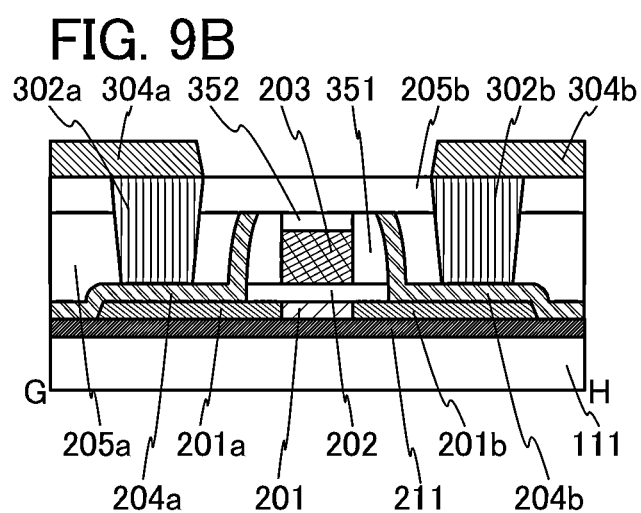

FIG. 9A is a schematic top view of a transistor 350 which is described in this structural example. FIG. 9B is a schematic cross-sectional view along line G-H in FIG. 9A. Note that some components (e.g., the insulating layer 205a and the insulating layer 205b) are not illustrated in FIG. 9A for simplicity.

The transistor 350 includes the semiconductor layer 201 which is in contact with the top surface of the insulating layer 211 provided over the substrate 111 and includes the regions 201a and 201b where resistances are reduced; the gate electrode layer 203 which is formed over the semiconductor layer 201 with the gate insulating layer 202 provided therebetween; an insulating layer 352 in contact with the top surface of the gate electrode layer 203; an insulating layer 351 which covers a side surface of the gate electrode layer 203; the source electrode layer 204a and the drain electrode layer 204b each of which is in contact with a side surface of the insulating layer 351 and the top surface of the semiconductor layer 201; the insulating layer 205a which covers the source electrode layer 204a and the drain electrode layer 204b; the insulating layer 205b which covers the insulating layer 205a and the gate electrode layer 203; the contact plug 302a and the contact plug 302b electrically connected to the source electrode layer 204a and the drain electrode layer 204b, respectively, through opening portions provided in the insulating layer 205a and the insulating layer 205b; and the source wiring 304a and the drain wiring 304b electrically connected to the contact plug 302a and the contact plug 302b, respectively.

Here, the insulating film of one embodiment of the present invention is applied to the insulating layer 211 in contact with the semiconductor layer 201. Note that one embodiment of the present invention is not limited thereto and the insulating film can also be applied to the gate insulating layer 202 in contact with the semiconductor layer 201.

The source electrode layer 204a and the drain electrode layer 204b each of which is in contact with the side surface of the insulating layer 351 provided on the side surface of the gate electrode layer 203 are electrically separated from each other by planarization treatment. Since the distance between the gate electrode layer 203 and the source electrode layer 204a or the drain electrode layer 204b is determined by the width of the insulating layer 351, the source electrode layer 204a and the drain electrode layer 204b can be formed so as to be close to the gate electrode layer 203 in a self-aligned manner; thus, an extremely miniaturized transistor can be obtained.

Further, the gate insulating layer 202 in regions which do not overlap with the gate electrode layer 203 nor the insulating layer 351 is removed and the source electrode layer 204a and the drain electrode layer 204b are electrically connected to the semiconductor layer 201 in the regions. With such a structure, the area where the semiconductor layer 201 and the source and drain electrode layers 204a and 204b are connected to each other can be increased and thus contact resistance therebetween can be reduced.

Similarly to Structural Example 3, the top surfaces of the contact plug 302a and the contact plug 302b are planarized and the source wiring 304a and the drain wiring 304b are provided over the planarized top surfaces. As described above, the process of manufacturing the transistor 300 is compatible with a process a process using single crystal silicon. Thus, the transistor 350 can be formed in combination with a semiconductor circuit including a single crystal silicon substrate.

When the insulating film of one embodiment of the present invention is applied to the insulating layer in contact with the semiconductor layer 201 as described above, oxygen can be effectively supplied to the semiconductor layer 201 in the method for forming the insulating film; thus, oxygen vacancies in the film can be reduced and the transistor 350 with excellent electrical characteristics can be obtained.

The above is a description of the transistor 350 described in this structural example.

Manufacturing Process Example 4

In this manufacturing process example, an example of a manufacturing process of the transistor described in Structural Example 4 will be described with reference to the drawings. FIGS. 10A to 10E are schematic cross-sectional views illustrating an example of a manufacturing process of the transistor 350.

Note that in this structural example, a description that overlaps with the portions described in the above manufacturing process example is omitted or is simply given.

First, the insulating layer 211 is formed over the substrate 111. Here, the insulating film of one embodiment of the present invention is applied to the insulating layer 211. The insulating layer 211 can be formed by the formation method described in Embodiment 1 as an example. Note that an insulating layer having a barrier property against oxygen and impurities such as hydrogen or moisture may be provided between the substrate 111 and the insulating layer 211.

As the substrate 111, any of the substrates described in Manufacturing Process Example 3 as examples can be used.

Next, an oxide semiconductor film is formed in contact with the top surface of the insulating layer 211 and is selectively etched by a photolithography method to form the island-shaped semiconductor layer 201.

Then, the gate insulating layer 202 covering an exposed portion of the insulating layer 211 and the semiconductor layer 201 is formed.

Figure 10A:
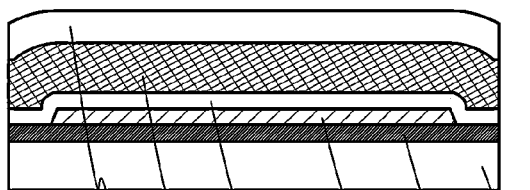
FIGS. 10A to 10E illustrate a method for manufacturing a semiconductor device of one embodiment of the present invention.

Subsequently, the conductive film 223 which is to be the gate electrode layer 203 is formed over the gate insulating layer 202. Then, an insulating film 362 which is to be the insulating layer 352 is formed over the conductive film 223 (FIG. 10A).

After that, the insulating film 362 and the conductive film 223 are selectively etched by a photolithography method to form the gate electrode layer 203 and the insulating layer 352 over the gate electrode layer 203.

At this time, the above-described slimming process may be performed to miniaturize the gate electrode layer 203.

The insulating layer 352 is provided to electrically separate the gate electrode layer 203 from the source electrode layer 204a and the drain electrode layer 204b without fail when the source electrode layer 204a and the drain electrode layer 204b are formed by the planarization treatment performed later. In the case where the controllability of the planarization treatment is extremely high, the insulating layer 352 is not necessarily provided.

After that, a dopant (not illustrated) is introduced into the semiconductor layer 201 through the gate insulating layer 202 using the gate electrode layer 203 as a mask to form the regions 201a and 201b which function as a pair of low-resistance regions.

Here, heat treatment for supplying oxygen from the insulating layer 211 to the semiconductor layer 201 is performed. By the heat treatment, oxygen is supplied to the semiconductor layer 201 and oxygen vacancies in the oxide semiconductor film which forms the semiconductor layer 201 can be effectively filled.

When heat treatment is performed after the dopant is introduced as described above, the heat treatment for supplying oxygen can also serve as heat treatment for activation of the dopant.

Figure 10B:
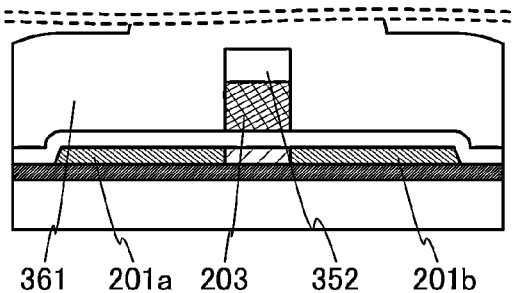

Next, an insulating film 361 covering the gate insulating layer 202, side surfaces of the gate electrode layer 203, and the insulating layer 352 is formed (FIG. 10B). Note that part of an upper portion of the insulating film 361 is not illustrated in FIG. 10B.

The insulating film 361 and the insulating film 362 can each be formed using an inorganic insulating material similar to that of the insulating film 225.

After that, anisotropic etching is performed on the insulating film 361 without a mask to form the insulating layer 351 covering the side surfaces of the gate electrode layer 203. At this time, the gate insulating layer 202 in regions which are not covered by the gate electrode layer 203 nor the insulating layer 351 is also etched at the same time, whereby the top surfaces of the semiconductor layer 201 in the regions are exposed.

Figure 10C:
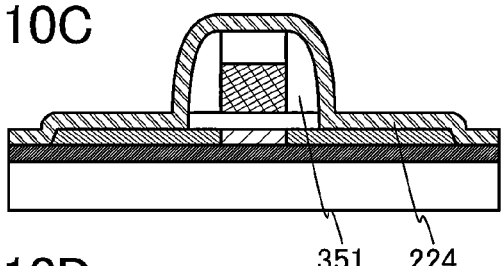

Subsequently, the conductive film 224 which is to be the source electrode layer 204a and the drain electrode layer 204b is formed so as to be in contact with the exposed portions of the semiconductor layer 201 and to cover the insulating layer 351 and the gate electrode layer 203 (FIG. 10C).

Then, an insulating film (not illustrated) which is to be the insulating layer 205a is formed to cover the conductive film 224. Here, the insulating film is formed so that the top surface thereof is at least higher than the top surface of the gate electrode layer 203.

Figure 10D:
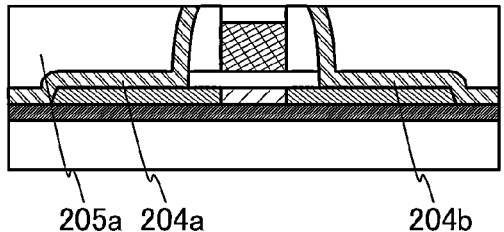

Next, the planarization treatment is performed so that an upper portion of the insulating film is removed, to form the insulating layer 205a. At the same time, a portion of the conductive film 224 which overlaps with the gate electrode layer 203 and an upper portion of the insulating layer 351 are removed to form the source electrode layer 204a and the drain electrode layer 204b which are electrically separated from each other are formed (FIG. 10D).

The planarization treatment is performed so that at least the top surface of the insulating layer 351 is exposed. Since the insulating layer 352 is provided so as to overlap with the gate electrode layer 203, the allowable range for the planarization treatment in the depth direction can be larger by the thickness of the insulating layer 352. The planarization treatment is preferably performed so that the top surface of the gate electrode layer 203 is not exposed.

After that, an insulating film (not illustrated) which is to be the insulating layer 205b is formed so as to cover the insulating layer 205a and exposed portions of the source electrode layer 204a and the drain electrode layer 204b.

Then, the insulating film and the insulating layer 205a are selectively etched by a photolithography method to form opening portions which reach the source electrode layer 204a and the drain electrode layer 204b.

Subsequently, a conductive film (not illustrated) which is to be the contact plug 302a and the contact plug 302b is formed so as to fill the opening portions.

Next, planarization treatment is performed again to remove an upper portion of the conductive film and an upper portion of the insulating film to form the insulating layer 205b, the contact plug 302a, and the contact plug 302b.

Figure 10E:
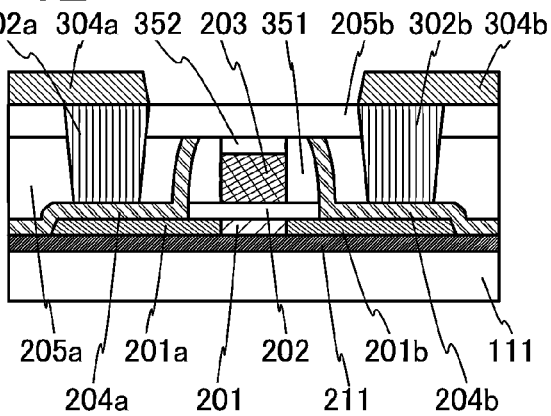

After that, the source wiring 304a and the drain wiring 304b which are electrically connected to the contact plugs 302a and 302b, respectively, are formed over the insulating layer 205b (FIG. 10E).

Through the above-described steps, the transistor 350 can be manufactured.

In this manufacturing process example, the heat treatment for supplying oxygen from the insulating film of one embodiment of the present invention to the oxide semiconductor film is performed after the dopant is introduced; however, the timing of the heat treatment is not limited thereto and the heat treatment may be performed at any stage after the oxide semiconductor film and the insulating film are formed. For example, in the case where the insulating film of one embodiment of the present invention is applied also to the gate insulating layer 202, heat treatment may be performed twice: after the oxide semiconductor film is formed, and after the gate insulating layer 202 is formed.

In the case where dehydrogenation treatment and oxygen supplying treatment are performed on the oxide semiconductor film, the treatments may be performed at any stage after the oxide semiconductor film is formed. Note that the oxygen supplying treatment is preferably performed after the dehydrogenation treatment.

The above is a description of the example of a manufacturing process of the transistor 350 described in this manufacturing process example.

The transistors described in this embodiment as examples are highly reliable transistors having excellent electrical characteristics, in each of which the insulating film of one embodiment of the present invention is provided in contact with a semiconductor layer formed of an oxide semiconductor film, and oxygen is supplied from the insulating film by heat treatment in a manufacturing process of the transistor to effectively fill oxygen vacancies. Further, heat treatment for supplying oxygen from the insulating film of one embodiment of the present invention is performed at a temperature higher than any other steps of the manufacturing process, whereby supplied oxygen is prevented from being eliminated. Thus, a transistor including an oxide semiconductor film in which oxygen vacancies are sufficiently reduced can be manufactured.

The transistor described in this embodiment as an example can be extremely miniaturized and thus can be applied to a semiconductor circuit such as an IC or a CPU. Owing to extremely favorable off-state current characteristics of the transistor, a substantially nonvolatile memory element can be obtained by application of the transistor to a memory element such as a DRAM or a SRAM.

This embodiment can be combined with any of the other embodiments and example described in this specification as appropriate.

Embodiment 4

A semiconductor device disclosed in this specification can be applied to a variety of electronic devices (including game machines). Examples of the electronic devices include a television set (also referred to as a television or a television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 11A to 11C and FIGS. 12A to 12C.

Figure 11A:
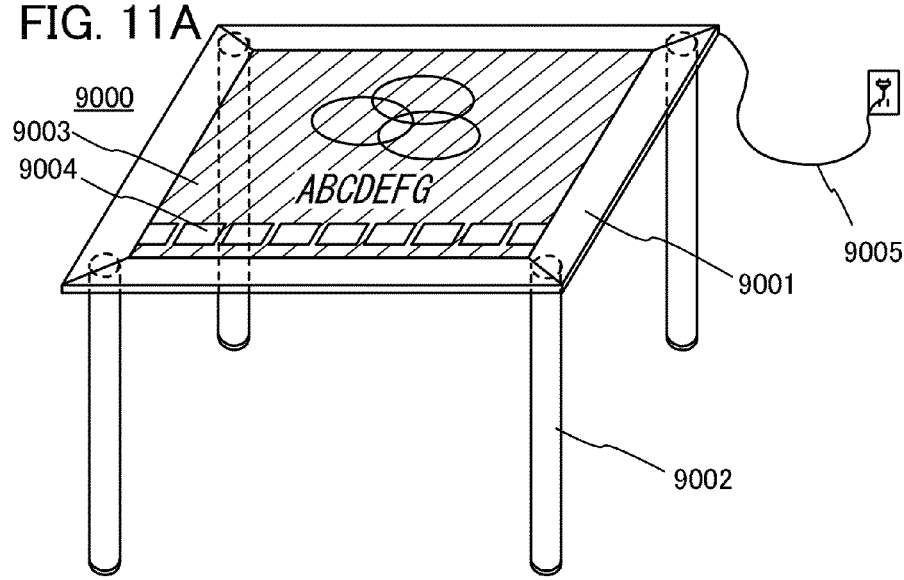
FIGS. 11A to 11C each illustrate an electronic device of one embodiment of the present invention.

FIG. 11A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device of one embodiment of the present invention can be used for the display portion 9003, whereby the electronic device can be provided with high reliability.

The display portion 9003 has a touch-input function. A user can touch displayed buttons 9004 which are displayed on the display portion 9003 of the table 9000 with his/her finger or the like, to carry out screen operation or input information. Further, when the table may be made to communicate with home appliances or control the home appliances, the table 9000 may function as a control device which controls the home appliances by the screen operation.

Further, the screen of the display portion 9003 can be placed perpendicular to a floor with a hinge provided for the housing 9001; thus, the table 9000 can also be used as a television device. Although when a television device having a large screen is set in a small room, an open space is reduced accordingly, a display portion incorporated in a table enables a space in the room to be efficiently used.

Figure 11B:
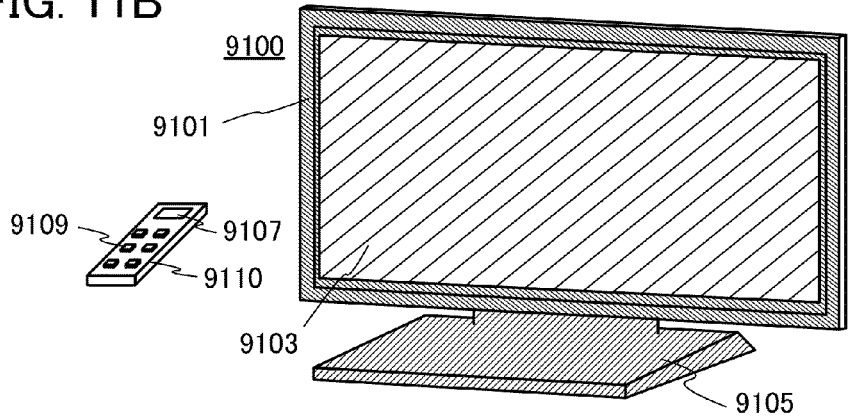

FIG. 11B illustrates a television set 9100. In the television set 9100, a display portion 9103 is incorporated in a housing 9101 and an image can be displayed on the display portion 9103. The housing 9101 is supported by a stand 9105 in the drawing.

The television set 9100 can be operated with an operation switch provided for the housing 9101 or a separate remote controller 9110. Channels and volume can be controlled with an operation key 9109 provided for the remote controller 9110 so that an image displayed on the display portion 9103 can be controlled. The remote controller 9110 may be provided with a display portion 9107 for displaying data output from the remote controller 9110.

The television set 9100 illustrated in FIG. 11B is provided with a receiver, a modem, and the like. With the receiver, the television set 9100 can receive general TV broadcasts. Further, the television set 9100 can be connected to a communication network with or without wires via the modem, enabling one-way (from sender to receiver) or two-way (between sender and receiver or between receivers) data communication.

The semiconductor device of one embodiment of the present invention can be used for the display portions 9103 and 9107, and control circuits in the housing 9101 and the remote controller 9110 so that the television device and the remote controller can be highly reliable.

Figure 11C:
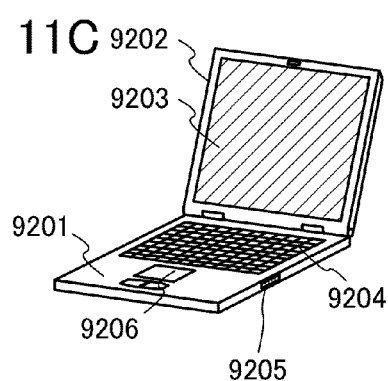

FIG. 11C illustrates a computer which includes a main body 9201, a housing 9202, a display portion 9203, a keyboard 9204, an external connection port 9205, a pointing device 9206, and the like. The computer is manufactured using the semiconductor device of one embodiment of the present invention for the display portion 9203, or an integrated circuit or a storage device in the housing 9202. When the semiconductor device described in the above embodiment is used, the computer can have a high reliability.

Figure 12A:
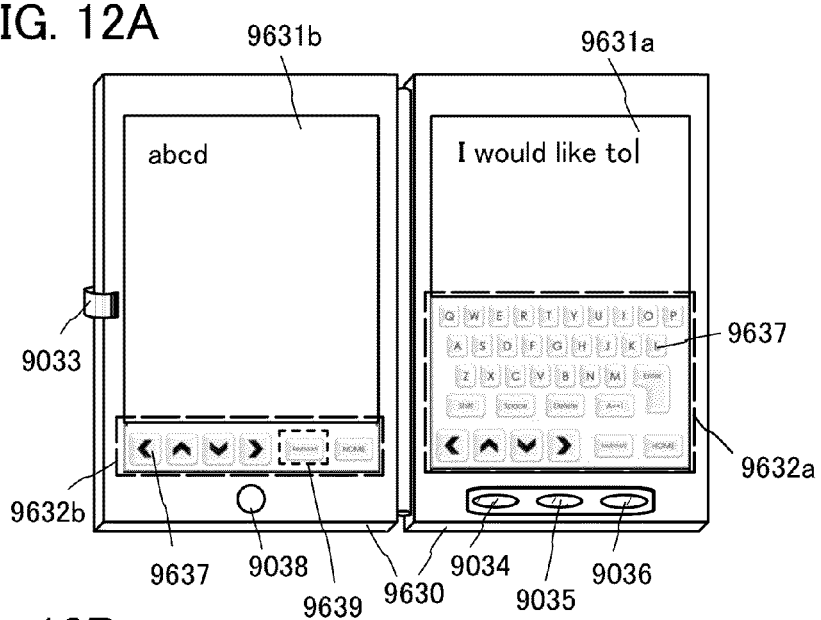
FIGS. 12A to 12C illustrate an electronic device of one embodiment of the present invention.
Figure 12B:
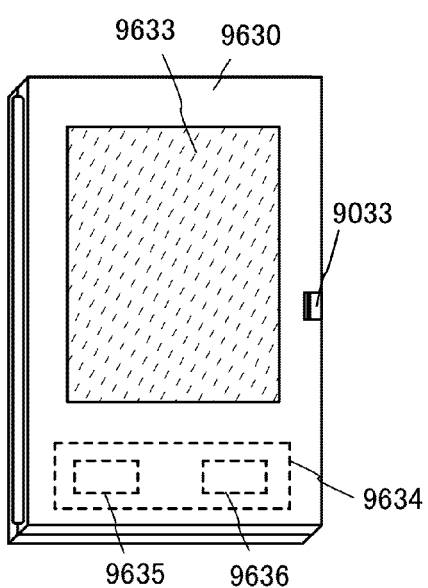

FIGS. 12A and 12B illustrate a tablet terminal that can be folded. FIG. 12A illustrates the tablet terminal which is open. The tablet terminal includes a housing 9630, a display portion 9631a, a display portion 9631b, a display-mode switching button 9034, a power button 9035, a power-saving-mode switching button 9036, a clip 9033, and an operation button 9038. Note that the tablet terminal is manufactured using the semiconductor device of one embodiment of the present invention for one of or both the display portion 9631a and the display portion 9631b and a control portion for controlling the display portion(s).

A touch panel region 9632a can be provided in a part of the display portion 9631a, in which data can be input by touching displayed operation keys 9637. In the drawing, as an example, one half of the area of the display portion 9631a has only a display function and the other half of the area has a touch panel function; however, embodiments of the present invention are not limited to this structure. All the area of the display portion 9631a may have a touch panel function. For example, all the area of the display portion 9631a can display keyboard buttons and serve as a touch panel while the display portion 9631b can be used as a display screen.

Like the display portion 9631a, a touch panel region 9632b can be formed in part of the display portion 9631b. Further, by touching a button 9639 for switching to keyboard display displayed on the touch panel, keyboard buttons can be displayed on the display portion 9631b.

Further, touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036, the luminance of display can be optimized in accordance with the content of external light at the time when the tablet is in use, which is detected with an optical sensor incorporated in the tablet terminal. The tablet terminal may include another detection device such as a sensor for detecting inclination (e.g., a gyroscope or an acceleration sensor) in addition to the optical sensor.

Although the display portion 9631a and the display portion 9631b have the same display area in FIG. 12A, embodiments of the present invention are not limited to this structure. The display portion 9631a and the display portion 9631b may have different areas or different display quality. For example, one of them may be a display panel that can display higher-definition images than the other.

FIG. 12B illustrates the tablet terminal closed, which includes the housing 9630, a solar cell 9633, a charge and discharge control circuit 9634, a battery 9635, and a DCDC converter 9636. FIG. 12B shows an example in which the charge and discharge control circuit 9634 includes the battery 9635 and the DCDC converter 9636.

Since the tablet terminal can be folded in two, the housing 9630 can be closed when the tablet terminal is not in use. Thus, the display portions 9631*a* and 9631*b* can be protected, thereby providing the tablet terminal with high endurance and high reliability for long-term use.

The tablet terminal illustrated in FIGS. 12A and 12B can also have a function of displaying a variety of kinds of data (e.g., a still image, a moving image, and a text image), a function of displaying a calendar, a date, the time, or the like on the display portion, a touch-input function of operating or editing data displayed on the display portion by touch input, a function of controlling processing by a variety of kinds of software (programs), and the like.

The solar cell 9633, which is attached on the surface of the tablet terminal, supplies electric power to a touch panel, a display portion, an image signal processor, and the like. Note that the solar cell 9633 can be provided on one or both surfaces of the housing 9630, so that the battery 9635 can be charged efficiently. A lithium ion battery can be used as the battery 9635, leading to an advantage of downsizing or the like.

Figure 12C:
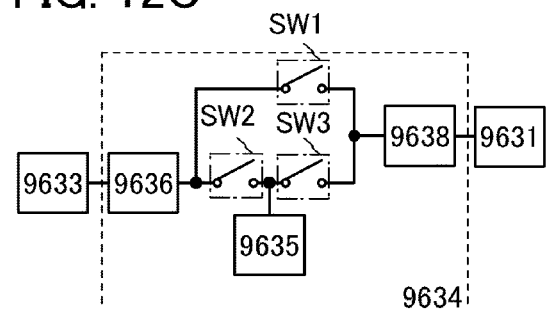

The structure and the operation of the charge and discharge control circuit 9634 illustrated in FIG. 12B are described with reference to a block diagram of FIG. 12C. The solar cell 9633, the battery 9635, the DCDC converter 9636, a converter 9638, switches SW1 to SW3, and the display portion 9631 are illustrated in FIG. 12C, and the battery 9635, the DCDC converter 9636, the converter 9638, and the switches SW1 to SW3 correspond to the charge and discharge control circuit 9634 illustrated in FIG. 12B.

First, an example of operation in the case where power is generated by the solar cell 9633 using external light is described. The voltage of power generated by the solar cell is raised or lowered by the DCDC converter 9636 to a voltage needed for charging the battery 9635. Further, when the display portion 9631 is operated with the power from the solar cell 9633, the switch SW1 is turned on and the voltage of the power is raised or lowered by the converter 9638 to a voltage needed for operating the display portion 9631. When display on the display portion 9631 is not performed, the switch SW1 may be turned off and the switch SW2 may be turned on so that the battery 9635 is charged.

Here, the solar cell 9633 is described as an example of a power generation means; however, there is no particular limitation on a way of charging the battery 9635, and the battery 9635 may be charged with any other power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

This embodiment can be combined with any of the other embodiments and example described in this specification as appropriate.

Example 1

In this example, results of TDS analysis of YSZ films and a $SiO_x$ film each of which was formed over a substrate are shown.

First, YSZ films and a $SiO_x$ film were each formed over a single crystal substrate of silicon by a sputtering method to form three samples. Conditions for each of the formed samples are shown in Table 1.

TABLE 1

| | Substrate | Film | Thickness | Substrate Temperature |
|---|---|---|---|---|
| Sample 1 | Si | YSZ | 100 nm | R.T. |
| Sample 2 | Si | YSZ | 100 nm | 300° C. |
| Sample 3 | Si | $SiO_x$ | 300 nm | 100° C. |

The YSZ films were each formed to have a thickness of about 100 nm in the following conditions: a YSZ target having the content ratio where $ZrO_2:Y_2O_3=92:8$ was used; the flow ratio of argon to oxygen was 1:1; and the pressure was 0.4 Pa. At this time, the YSZ film formed at a substrate temperature of room temperature was Sample 1 and the YSZ film formed at a substrate temperature of 300° C. was Sample 2.

The $SiO_x$ film was formed to have a thickness of about 300 nm in the following conditions: a $SiO_2$ target was used; the flow ratio of argon to oxygen was 1:1; and the pressure was 0.4 Pa. At this time, the $SiO_x$ film formed at a substrate temperature of 100° C. was Sample 3.

Then, each of Samples 1 to 3 was cut into approximately 1 cm square pieces and then TDS analysis was conducted. The TDS analysis was conducted in the following conditions: the temperature range was from 50° C. to 600° C., the pressure was $1.2 \times 10^{-7}$ Pa, and the rate of temperature increase was 30° C./min.

Figure 13:
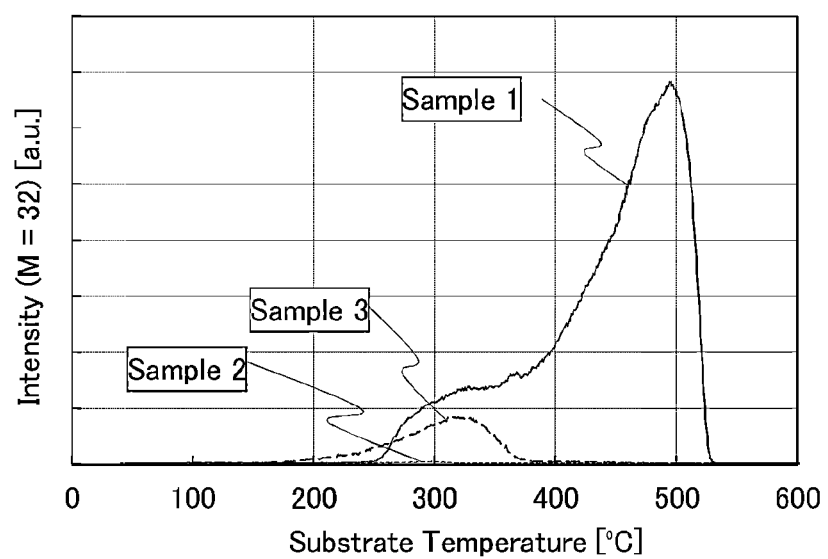
FIG. 13 shows results of TDS measurement in one example.

FIG. 13 shows results of the TDS analysis conducted on the samples. FIG. 13 shows the detection intensities of mass number 32 which corresponds to the mass number of an oxygen molecule with respect to the temperature.

In Sample 1, the amount of oxygen released was rapidly increased in a temperature range higher than 400° C. to the peak temperature of about 500° C.

In Sample 2, substantially no oxygen was released in the measurement temperature range.

In Sample 3, the amount of oxygen released was gradually increased from a temperature of around 200° C. to reach a peak at around 320° C. However, even though Sample 3 was about three times as thick as Sample 1, the peak of the amount was nine times as small as that of Sample 1.

The above results show that, as compared with a YSZ film formed at high temperatures and a $SiO_x$ film, the amount of oxygen released from a YSZ film formed at low temperatures in an oxygen atmosphere is extremely large and a temperature at which oxygen is released is extremely high.

Example 2

In this example, observation results of cross sections of Sample 1 and Sample 2 manufactured in Example 1 and Sample 4 which was Sample 1 subjected to TDS analysis are shown.

Sample 1 and Sample 2 used for the observation were samples before TDS analysis was conducted. As Sample 4, Sample 1 which had been heated to 600° C. in Example 1 so that oxygen therein was released was used. As pretreatment for the observation, an upper layer of each sample was coated with carbon and Pt.

The cross sections were observed by scanning transmission electron microscopy (STEM).

Figure 14A:
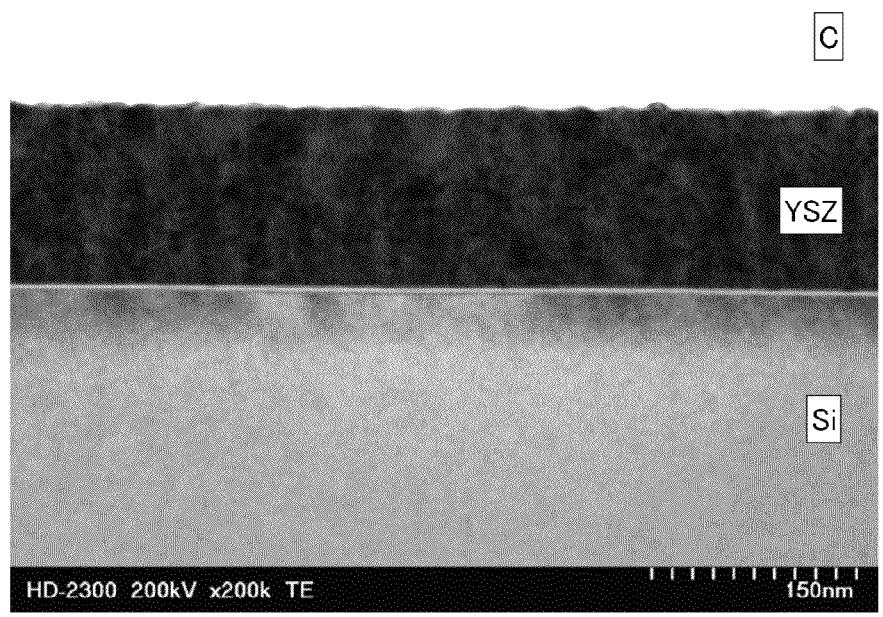
FIGS. 14A and 14B show observation results of a cross section of one example.
Figure 14B:
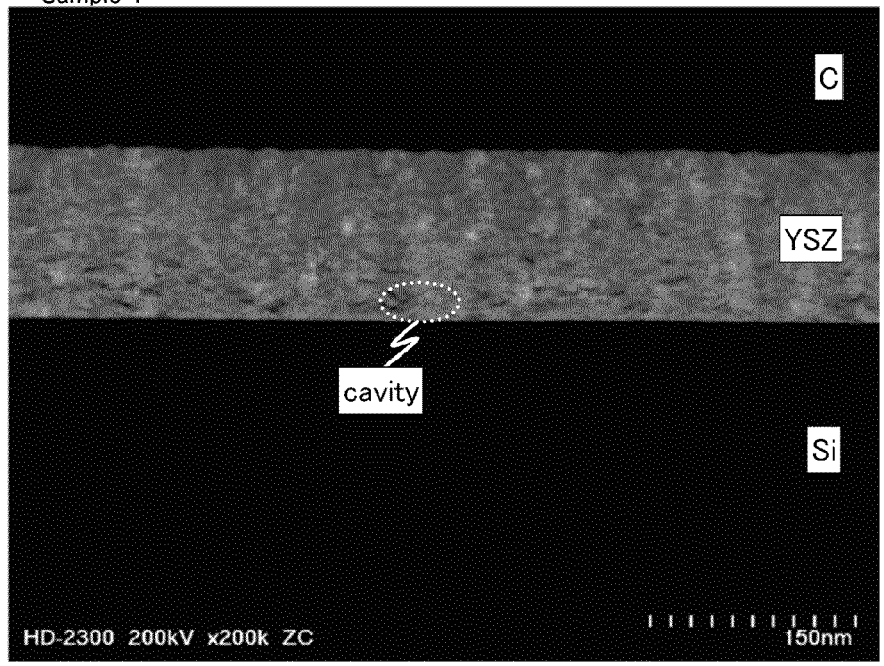

The observation results of the cross section of Sample 1 are shown in FIGS. 14A and 14B. FIG. 14A is a phase contrast image (TE image) and FIG. 14B is a Z contrast image (ZC image). It is found that the YSZ film of Sample 1 is not completely crystallized and an amorphous region is partly formed. Further, it can be confirmed that a number of cavities are dispersed in the film. A cross-sectional shape of each of the cavities is a shape which is elongated laterally with respect to a surface on which the YSZ film was formed, and cavities in a variety of sizes in a range from 1 nm to 50 nm in a direction parallel to the surface and a range from 1 nm to 20 nm in a direction perpendicular to the surface can be seen.

Figure 15A:
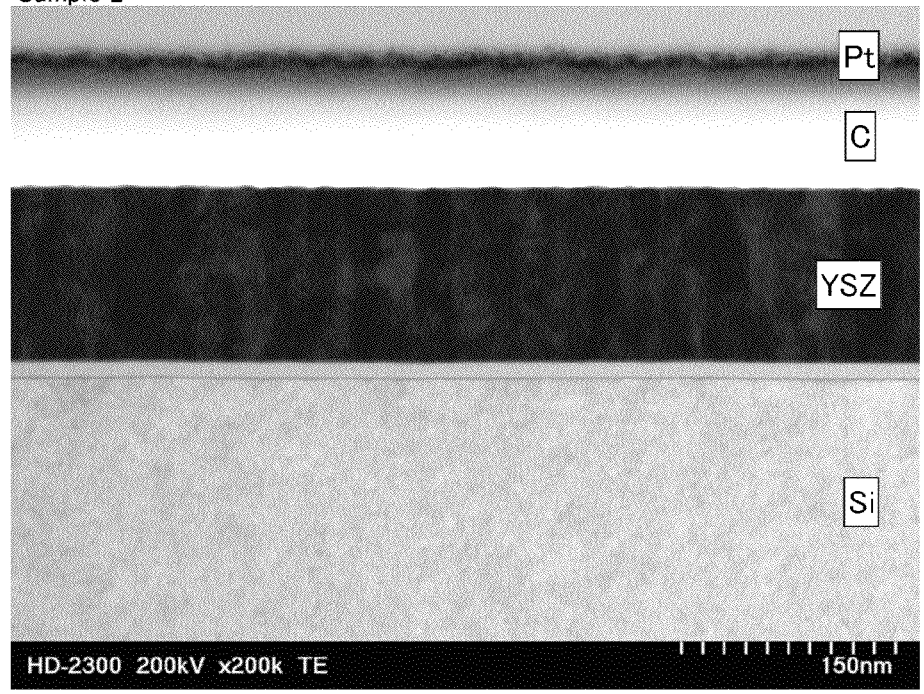
FIGS. 15A and 15B show observation results of a cross section of one example.
Figure 15B:
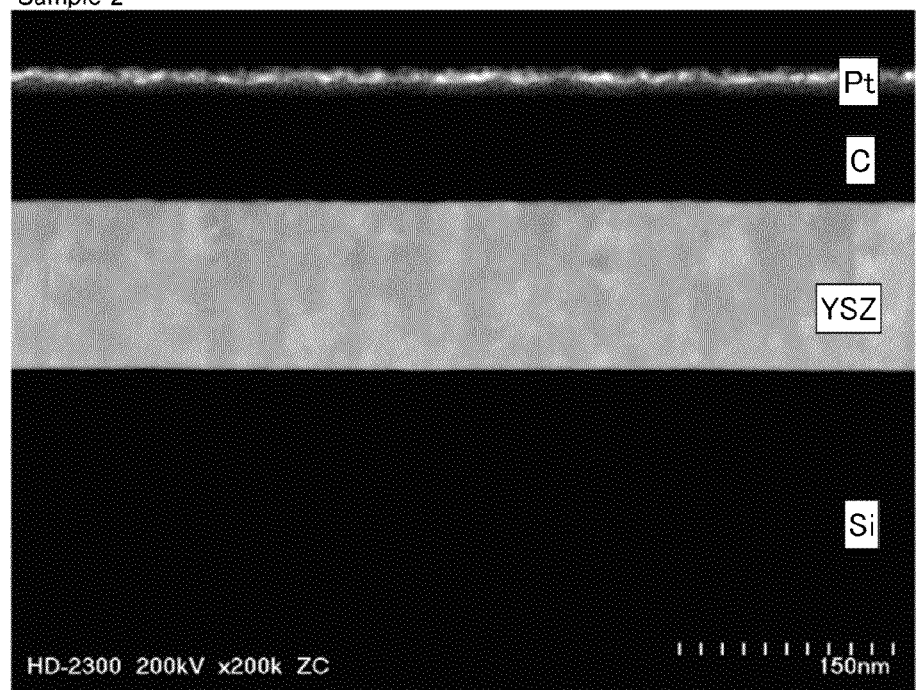

The observation results of the cross section of Sample 2 are shown in FIGS. 15A and 15B. FIG. 15A is a phase contrast image (TE image) and FIG. 15B is a Z contrast image (ZC image). It is found that the YSZ film of Sample 2 is substantially completely crystallized and a clear grain boundary which is substantially perpendicular to a surface on which the YSZ film was formed can be observed.

Figure 16A:
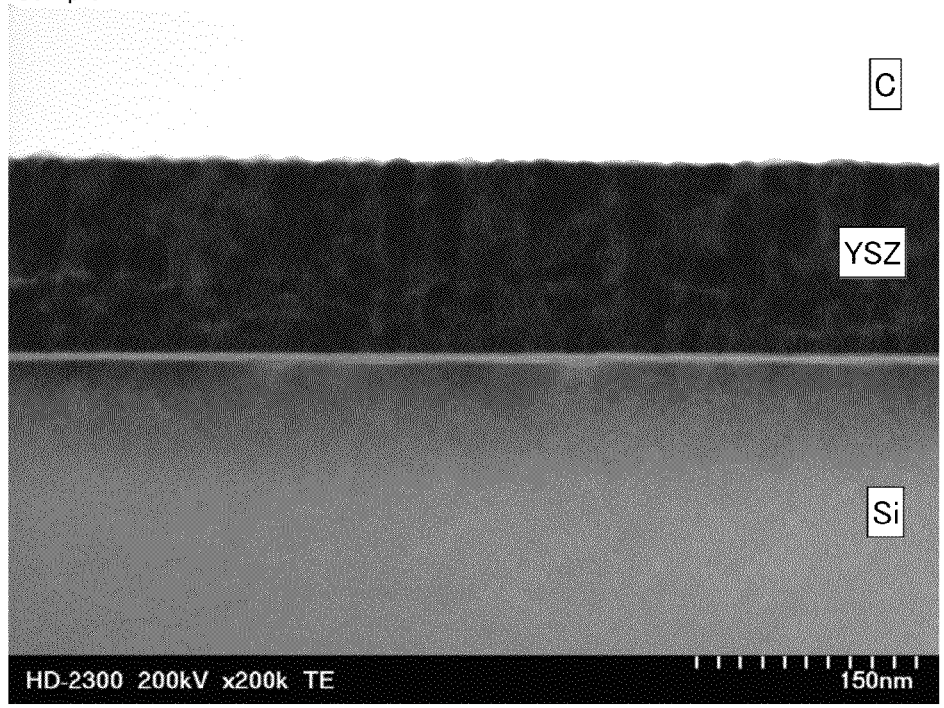
FIGS. 16A and 16B show observation results of a cross section of one example.
Figure 16B:
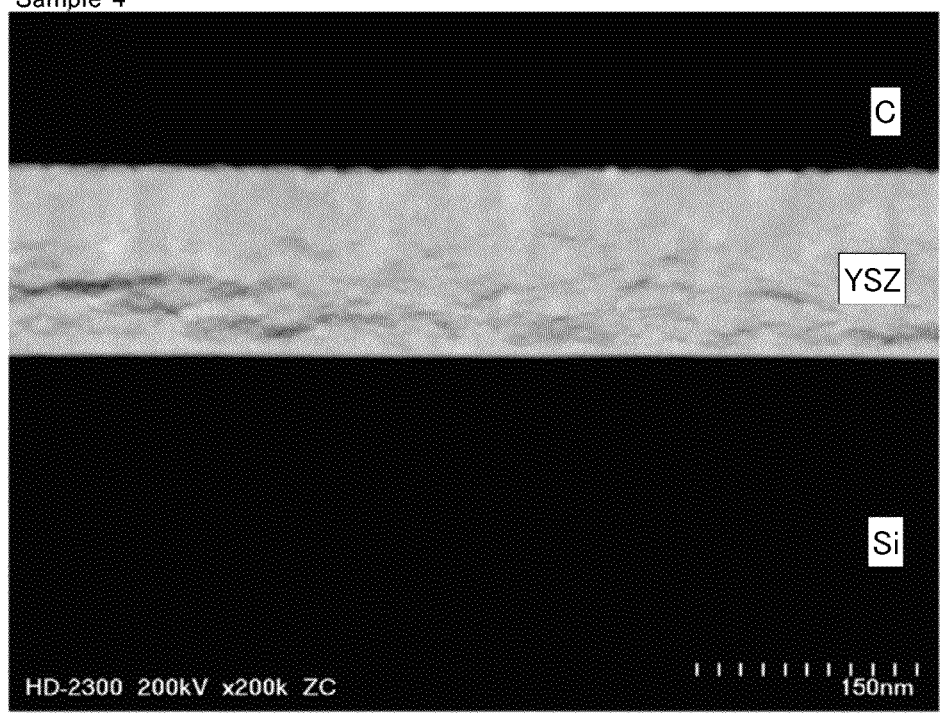

The observation results of the cross section of Sample 4 are shown in FIGS. 16A and 16B. FIG. 16A is a phase contrast image (TE image) and FIG. 16B is a Z contrast image (ZC image). It is found that an upper portion of the YSZ film of Sample 4 is substantially completely crystallized and a clear grain boundary which is perpendicular to a surface on which the YSZ film was formed can be observed. It can be observed that an amorphous region which is not completely crystallized exists in a lower portion which is close to the surface. It can also be observed that cavities each of which has a shape elongated laterally with respect to the surface and is larger than that in Sample 1 are concentrated in the region.

The above results indicate that an amorphous region with low density and a number of cavities are formed in a YSZ film formed at low temperatures in an oxygen atmosphere. The above results also indicate that when heat treatment is performed on the YSZ film to release oxygen therein, crystallization proceeds in an upper portion which is close to the top surface and an amorphous region and cavities remain mostly in a lower portion.

From the facts that a crystallized region in the YSZ film formed at low temperatures in an oxygen atmosphere is larger after oxygen was released than before oxygen was released and substantially no oxygen was released from the YSZ film having extremely high crystallinity, it is found that the amorphous region before oxygen was released contained oxygen in excess of the stoichiometric composition.

Example 3

In this example, measurement results of the film densities of YSZ films will be described.

Measurements of the film densities were performed on three samples: Sample 1, Sample 2, and Sample 5 which was separately formed. Note that Sample 1 and Sample 2 were samples before the TDS analysis was conducted.

Sample 5 was formed in the following manner: a YSZ film was formed over a Si substrate under the conditions similar to those of Sample 1 and then, heat treatment was performed with a temperature kept at 550° C. for 160 minutes in a nitrogen atmosphere.

The film densities of Sample 1, Sample 2, and Sample 5 were measured by X-ray reflectometry (XRR). Each of the film densities was calculated by optimizing and fitting parameters to measured profile of the reflectance at angles of incidence. Here, the "film density" is the film density of a region excluding the top surface of the YSZ film and an interface between the YSZ film and the substrate. The measurement results of the film densities are shown in Table 2.

TABLE 2

|  | Film Density |
| --- | --- |
| Sample 1 | 5.85 g/cm$^3$ |
| Sample 2 | 6.01 g/cm$^3$ |
| Sample 5 | 5.91 g/cm$^3$ |

It is found that the film density of Sample 1 formed at low temperatures is lower than that of Sample 2 formed at high temperatures. In addition, the film density of Sample 5 from which oxygen was released by heat treatment is lower than that of Sample 2; however, the film density of Sample 5 is slightly higher than that of Sample 1. It can be assumed that this is because, in view of the results of Example 1 and Example 2, the crystallization proceeded and excess oxygen contained in the film was released outside the film by the heat treatment, which led to an increase in the film density of Sample 5.

The above results indicate that a YSZ film formed at low temperatures in an oxygen atmosphere is a film having lower density than a YSZ film formed at high temperatures. The above results also indicate that even when the YSZ film formed at low temperatures is heated to release oxygen therein, the density is still lower than that of a YSZ film which is formed at high temperatures and completely crystallized.

This application is based on Japanese Patent Application serial no. 2011-252213 filed with Japan Patent Office on Nov. 18, 2011, the entire contents of which are hereby incorporated by reference.

What is claimed is:

1. An insulating film comprising zirconium oxide,
   wherein the insulating film comprises an amorphous region and a plurality of cavities dispersively located in the insulating film, and
   wherein each of the plurality of cavities has a size in which a length in a direction parallel to a surface of the insulating film is larger than a length in a direction perpendicular to the surface of the insulating film.

2. The insulating film according to claim 1, wherein a detection intensity of mass number 32 with respect to a temperature obtained by thermal desorption spectroscopy has at least one peak.

3. The insulating film according to claim 2, wherein the detection intensity has a peak at a temperature higher than or equal to 350° C.

4. The insulating film according to claim 1, further comprising yttrium, wherein a film density of the insulating film is higher than or equal to 5.40 g/cm$^3$ and lower than or equal to 5.95 g/cm$^3$.

5. A semiconductor device comprising:
   the insulating film according to claim 1;
   an oxide semiconductor layer;
   a gate insulating layer;
   a gate electrode;
   a source electrode; and
   a drain electrode,
   wherein the insulating film is provided in contact with the oxide semiconductor layer, and
   wherein the oxide semiconductor layer is located between the insulating film and the gate insulating layer.

6. The semiconductor device according to claim 5, wherein the oxide semiconductor layer is provided over the gate electrode with the gate insulating layer interposed therebetween.

7. The semiconductor device according to claim 5, wherein the gate electrode is provided over the oxide semiconductor layer with the gate insulating layer interposed therebetween.

8. A semiconductor device comprising:
an insulating film comprising zirconium oxide;
an oxide semiconductor layer;
a gate insulating layer comprising zirconium oxide;
a gate electrode;
a source electrode; and
a drain electrode,
wherein the gate insulating layer is provided in contact with the oxide semiconductor layer,
wherein the insulating film comprises an amorphous region and a plurality of cavities dispersively located in the insulating film,
wherein the gate insulating layer comprises an amorphous region and a plurality of cavities dispersively located in the gate insulating layer,
wherein each of the plurality of cavities in the insulating film has a size in which a length in a direction parallel to a surface of the insulating film is larger than a length in a direction perpendicular to the surface of the insulating film, and
wherein each of the plurality of cavities in the gate insulating layer has a size in which a length in a direction parallel to a surface of the gate insulating layer is larger than a length in a direction perpendicular to the surface of the gate insulating layer.

9. The semiconductor device according to claim 8, wherein the oxide semiconductor layer is provided over the gate electrode with the gate insulating layer interposed therebetween.

10. The semiconductor device according to claim 8, wherein the gate electrode is provided over the oxide semiconductor layer with the gate insulating layer interposed therebetween.

11. The semiconductor device according to claim 8, wherein the gate insulating layer further comprises yttrium.

* * * * *